United States Patent
More et al.

(10) Patent No.: US 11,640,983 B2
(45) Date of Patent: May 2, 2023

(54) SEMICONDUCTOR DEVICE AND METHOD

(71) Applicant: Taiwan Semiconductor Manufacturing Co., Ltd., Hsinchu (TW)

(72) Inventors: Shahaji B. More, Hsinchu (TW); Chandrashekhar Prakash Savant, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 35 days.

(21) Appl. No.: 17/212,367

(22) Filed: Mar. 25, 2021

(65) Prior Publication Data

US 2022/0052173 A1  Feb. 17, 2022

Related U.S. Application Data

(60) Provisional application No. 63/082,534, filed on Sep. 24, 2020, provisional application No. 63/065,563, filed on Aug. 14, 2020.

(51) Int. Cl.
*H01L 29/49* (2006.01)
*H01L 29/10* (2006.01)
*H01L 29/66* (2006.01)

(52) U.S. Cl.
CPC ...... *H01L 29/4916* (2013.01); *H01L 29/1033* (2013.01); *H01L 29/66545* (2013.01)

(58) Field of Classification Search
CPC ........... H01L 29/42376; H01L 29/1033; H01L 29/42372; H01L 27/0924
See application file for complete search history.

(56) References Cited

U.S. PATENT DOCUMENTS

| | | |
|---|---|---|
| 10,741,400 B2 | 8/2020 | Tsau et al. |
| 2004/0214416 A1 | 10/2004 | Woo et al. |
| 2007/0287404 A1 | 12/2007 | Arnborg |
| 2010/0123204 A1 | 5/2010 | Shin |
| 2011/0210403 A1 | 9/2011 | Teo et al. |
| 2011/0291175 A1 | 12/2011 | Jee et al. |
| 2015/0262823 A1 | 9/2015 | Hung et al. |
| 2016/0322471 A1 | 11/2016 | JangJian et al. |
| 2016/0365426 A1 | 12/2016 | Ching et al. |
| 2017/0162503 A1 | 6/2017 | Olac-Vaw et al. |
| 2017/0178967 A1 | 6/2017 | Greene et al. |
| 2018/0108748 A1* | 4/2018 | Chen ................ H01L 29/66795 |
| 2018/0151693 A1 | 5/2018 | Li et al. |

(Continued)

FOREIGN PATENT DOCUMENTS

| | | |
|---|---|---|
| KR | 20060030018 A | 4/2006 |
| KR | 20090028516 A | 3/2009 |

(Continued)

*Primary Examiner* — Changhyun Yi
(74) *Attorney, Agent, or Firm* — Slater Matsil, LLP

(57) ABSTRACT

In an embodiment, a device includes: a gate dielectric over a substrate; a gate electrode over the gate dielectric, the gate electrode including: a work function tuning layer over the gate dielectric; a glue layer over the work function tuning layer; a fill layer over the glue layer; and a void defined by inner surfaces of at least one of the fill layer, the glue layer, and the work function tuning layer, a material of the gate electrode at the inner surfaces including a work function tuning element.

20 Claims, 33 Drawing Sheets

(56) References Cited

U.S. PATENT DOCUMENTS

| | | |
|---|---|---|
| 2019/0273145 A1 | 9/2019 | Chiu et al. |
| 2020/0043919 A1 | 2/2020 | Ching et al. |
| 2020/0144384 A1 | 5/2020 | Sagong et al. |

FOREIGN PATENT DOCUMENTS

| | | |
|---|---|---|
| KR | 101652879 B1 | 9/2016 |
| KR | 20160129664 A | 11/2016 |
| KR | 20170042562 A | 4/2017 |
| KR | 20200051089 A | 5/2020 |

\* cited by examiner

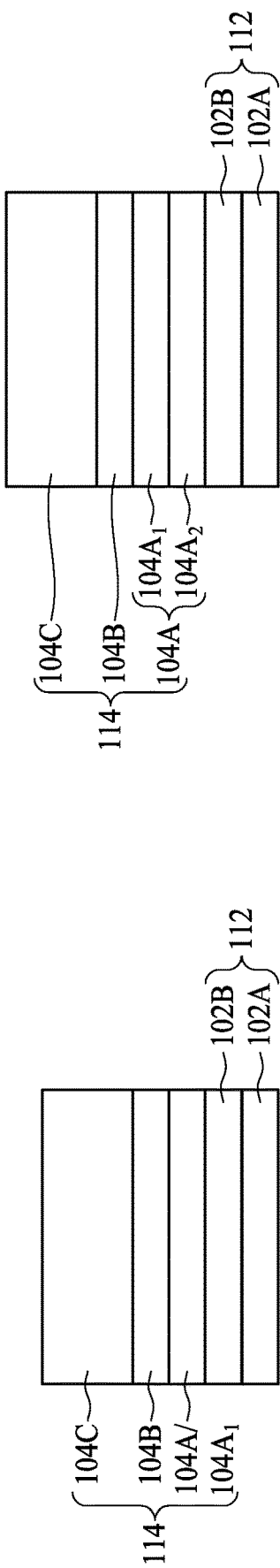
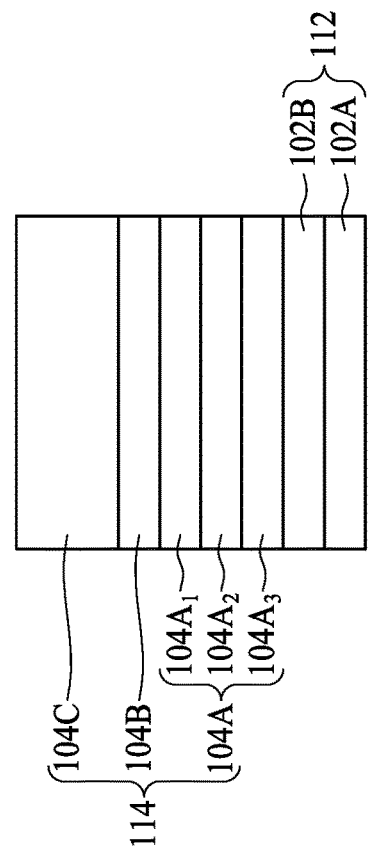
FIG. 29A
FIG. 29B
FIG. 29C

US 11,640,983 B2

SEMICONDUCTOR DEVICE AND METHOD

PRIORITY CLAIM AND CROSS-REFERENCE

This application claims the benefit of U.S. Provisional Application No. 63/082,534, filed on Sep. 24, 2020, and U.S. Provisional Application No. 63/065,563, filed on Aug. 14, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 29A through 29C are cross-sectional views of gate structure film stacks, in accordance with some embodiments.

DETAILED DESCRIPTION

Figure 1:
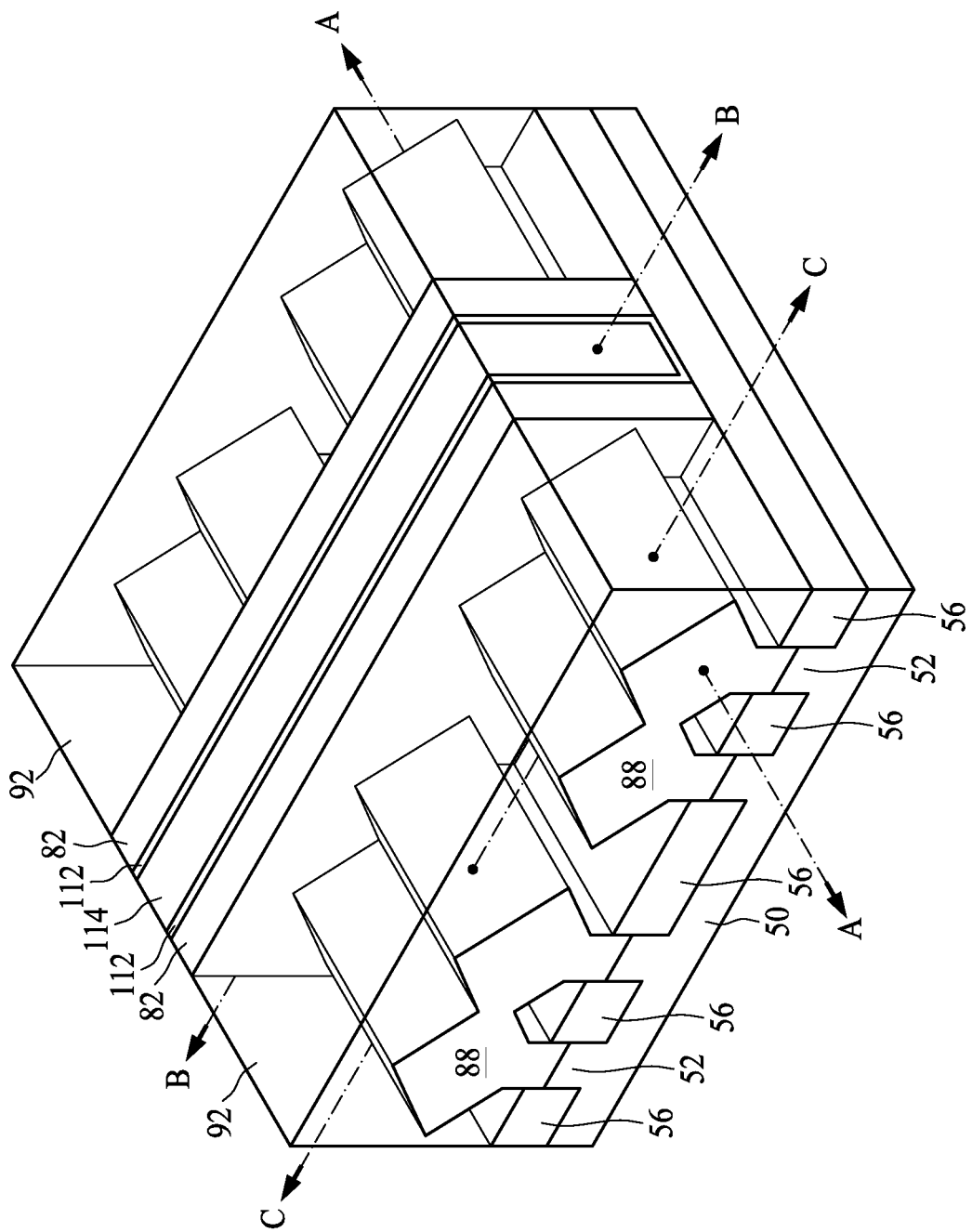
FIG. 1 illustrates an example of a FinFET in a three-dimensional view.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, devices are formed with short length channel regions and long length channel regions. Gate electrodes are formed over the channel regions. The gate electrodes over the short length channel regions are formed to have voids, and the gate electrodes over the long length channel regions are formed without voids (or at least have smaller voids). One or more gate treatment process(es) are performed to modify the work functions of the devices. The gate treatment process(es) affect the gate electrodes with voids (e.g., those over the short length channel regions) more than the gate electrodes without voids (e.g., those over the long length channel regions). Thus, the gate treatment process(es) may be used to selectively tune the threshold voltages of some devices, even when the gate treatment process(es) are performed across an entire substrate.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically connected or coupled in a manner to operate as, for example, one transistor or multiple transistors, such as two transistors.

The FinFETs include fins 52 extending from a substrate 50. Shallow trench isolation (STI) regions 56 are disposed over the substrate 50, and the fins 52 protrude above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fins 52 are illustrated as being a single, continuous material of the substrate 50, the fins 52 and/or the substrate 50 may include a single material or a plurality of materials. In this context, the fins 52 refer to the portions extending between the neighboring STI regions 56.

Gate dielectrics 112 are along sidewalls and over top surfaces of the fins 52, and gate electrodes 114 are over the gate dielectrics 112. Source/drain regions 88 are disposed in opposite sides of the fin 52 with respect to the gate dielectrics 112 and gate electrodes 114. Gate spacers 82 separate the source/drain regions 88 from the gate dielectrics 112 and the gate electrodes 114. An inter-layer dielectric (ILD) 92 is disposed over the source/drain regions 88 and STI regions 56. In embodiments where multiple transistors are formed, the source/drain regions 88 may be shared between various transistors. In embodiments where one transistor is formed from multiple fins 52, neighboring source/drain regions 88 may be electrically connected, such as through merging the source/drain regions 88 by epitaxial growth, or through coupling the source/drain regions 88 with a same source/drain contact.

FIG. 1 further illustrates several reference cross-sections. Cross-section A-A is along a longitudinal axis of a fin 52 and in a direction of, for example, a current flow between the source/drain regions 88 of the FinFETs. Cross-section B-B is perpendicular to cross-section A-A and is along a longitudinal axis of a gate electrode 114 and in a direction, for example, perpendicular to the direction of current flow between the source/drain regions 88 of the FinFETs. Cross-section C-C is parallel to cross-section B-B and extends through the source/drain regions 88 of the FinFETs. Subsequent figures refer to these reference cross-sections for clarity.

Figure 2:
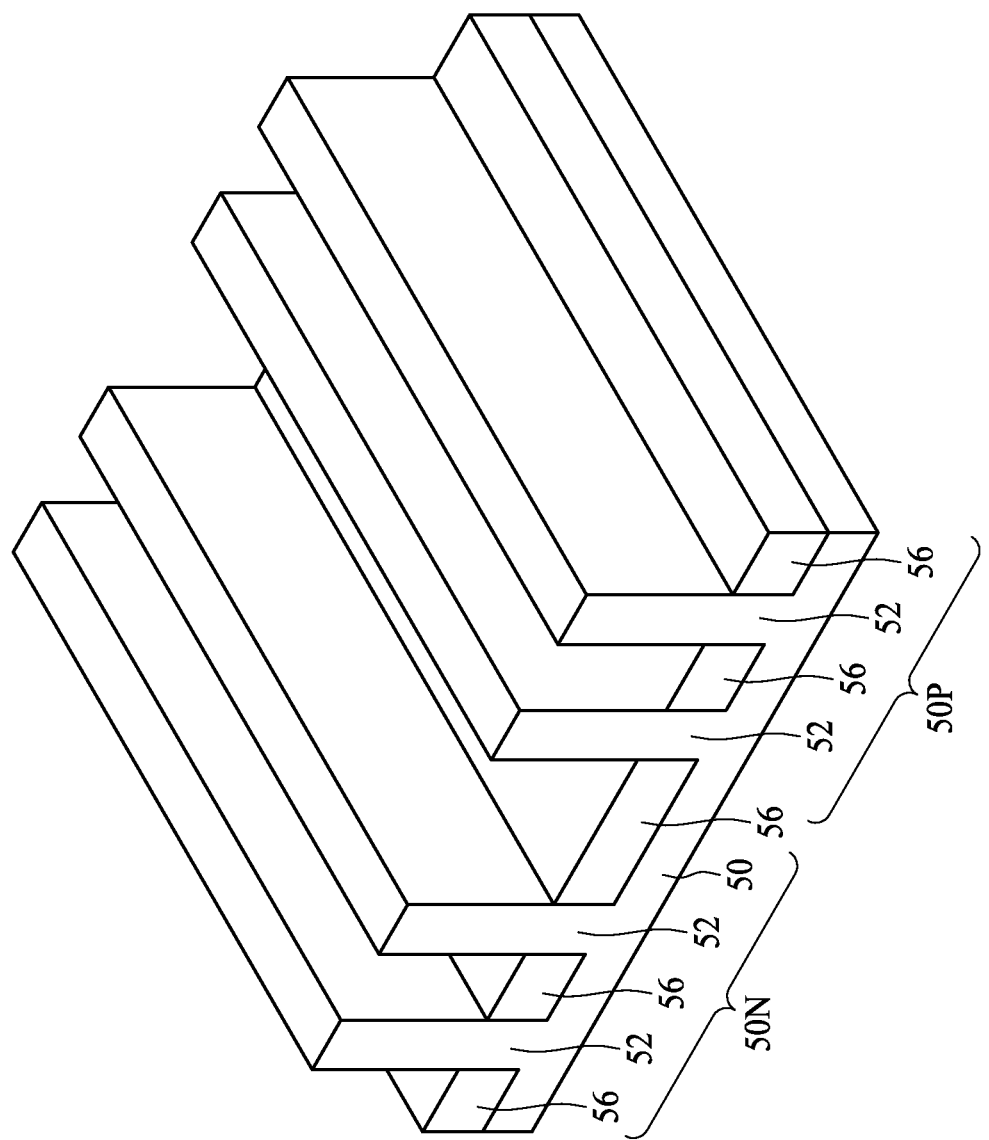
FIGS. 2 through 19B are various views of intermediate stages in the manufacturing of FinFETs, in accordance with some embodiments.
Figure 3:
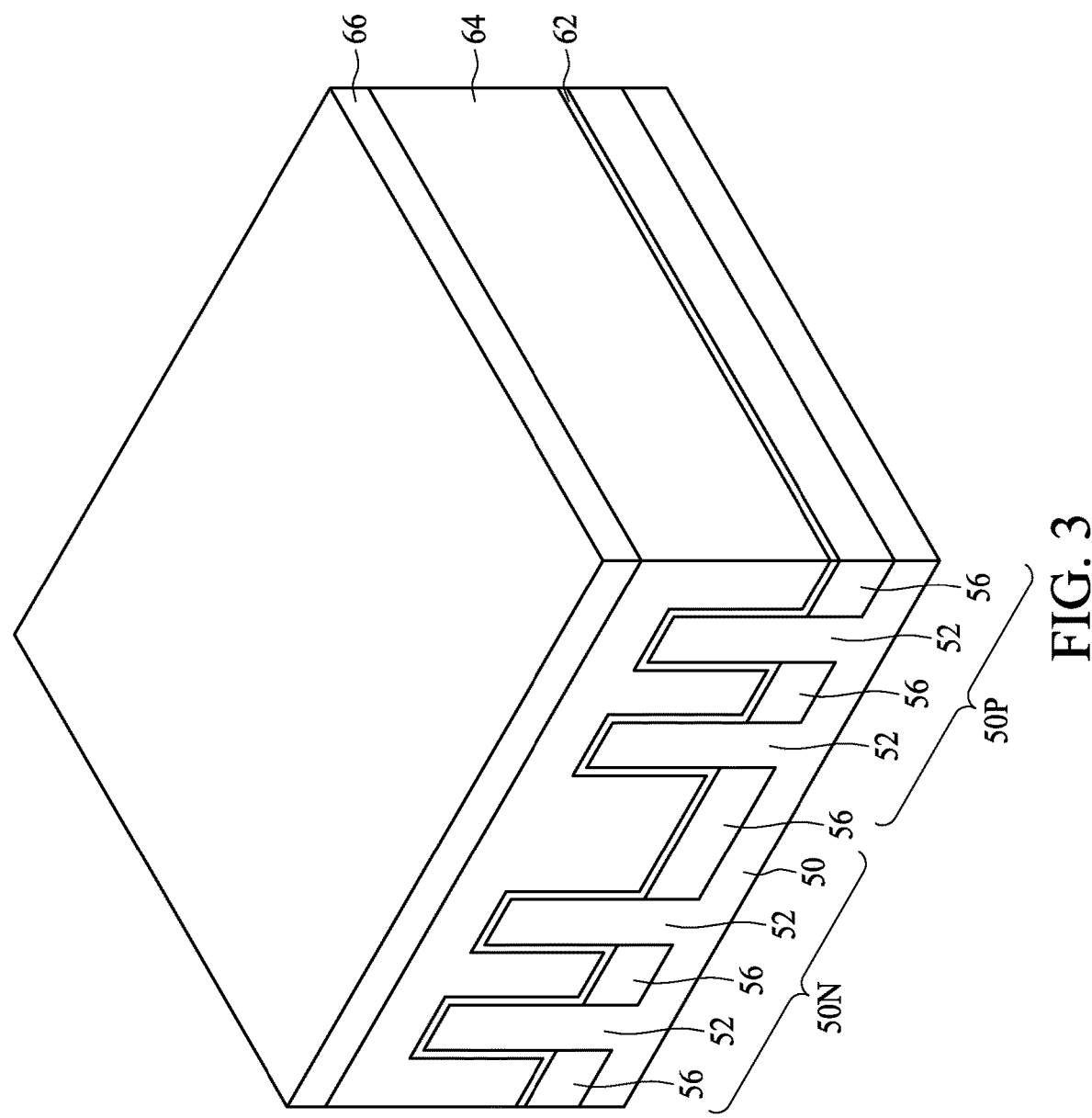
Figure 4:
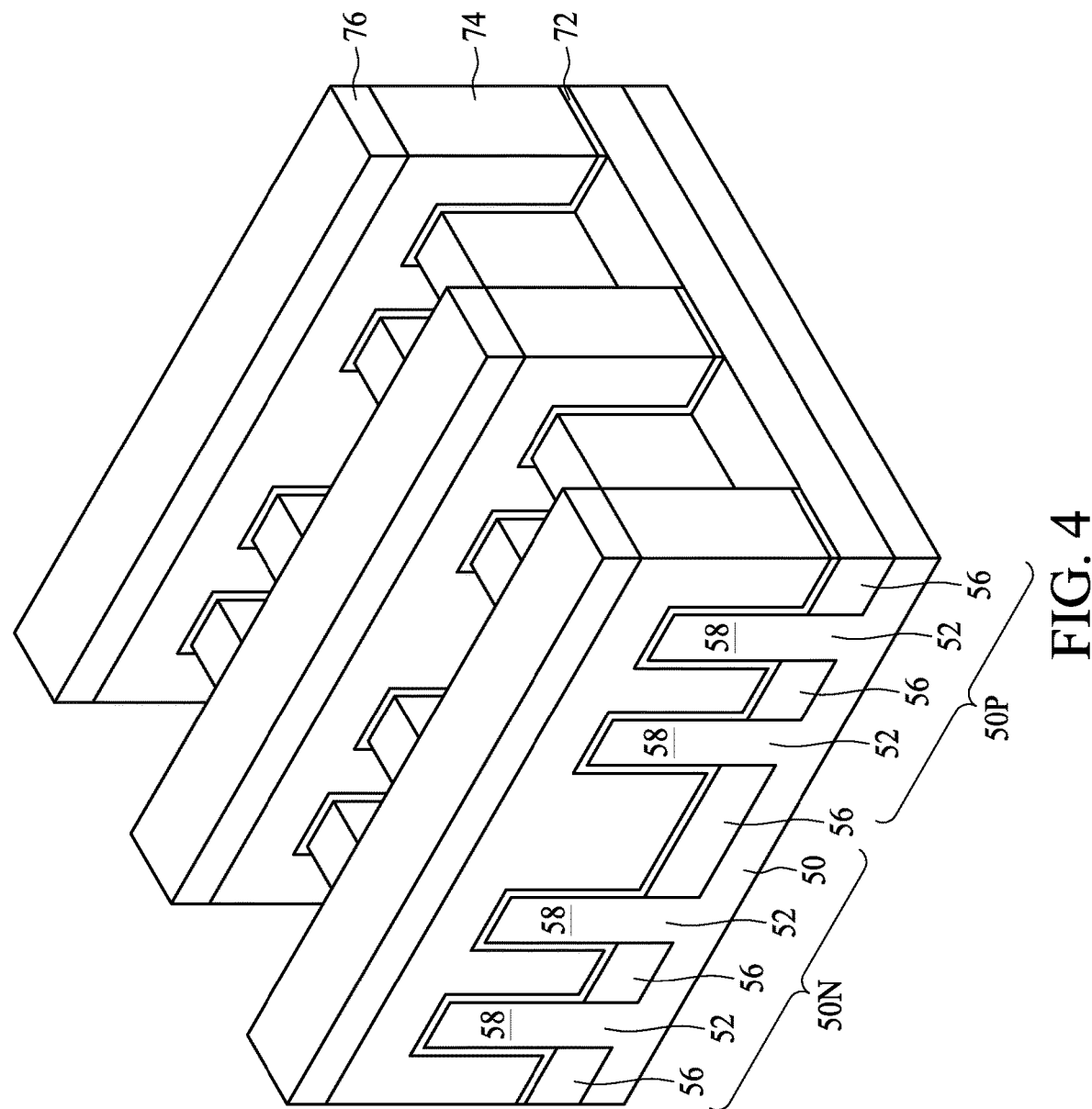

FIGS. 2 through 19B are various views of intermediate stages in the manufacturing of FinFETs, in accordance with some embodiments. FIGS. 2, 3, and 4 are three-dimensional views. FIGS. 5A, 6A, 7A, 8A, 9A, 10A, 10B, 11A, 11B, 12A, 12B, 13A, 13B, 14A, 14B, 18A, and 19A are cross-sectional views illustrated along a similar cross-section as reference cross-section A-A in FIG. 1. FIGS. 5B, 6B, 7B, 8B, 9B, 15A, 15B, 16A, 16B, 17A, 17B, 18B, and 19B are cross-sectional views illustrated along a similar cross-section as reference cross-section B-B in FIG. 1. FIGS. 6C and 6D are cross-sectional views illustrated along a similar cross-section as reference cross-section C-C in FIG. 1.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or a n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P, and any number of device features (e.g., other active devices, doped regions, isolation structures, etc.) may be disposed between the n-type region 50N and the p-type region 50P.

Fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 52. In some embodiments, the mask (or other layer) may remain on the fins 52.

STI regions 56 are formed over the substrate 50 and between neighboring fins 52. As an example to form the STI regions 56, an insulation material can be formed over the substrate 50 and between neighboring fins 52. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the fins 52. Although the STI regions 56 are illustrated as a single layer, some embodiments may utilize multiple layers. For example, in some embodiments, a liner (not shown) may first be formed along a surface of the substrate 50 and the fins 52. Thereafter, a fill material, such as those discussed above may be formed over the liner. A removal process is then applied to the insulation material to remove excess insulation material over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material are coplanar (within process variations) after the planarization process is complete. In embodiments in which a mask remains on the fins 52, the planarization process may expose the mask or remove the mask such that top surfaces of the mask or the fins 52, respectively, and the insulation material are coplanar (within process variations) after the planarization process is complete. The insulation material is then recessed to form the STI regions 56. The insulation material is recessed such that upper portions of the fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material (e.g., etches the material of the insulation material at a faster rate than the material of the fins 52). For example, an oxide removal using, for example, dilute hydrofluoric (dHF) acid may be used.

The process described with respect to FIG. 2 is just one example of how the fins 52 may be formed. In some embodiments, the fins 52 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 can be recessed, and a material different from the fins 52 may be epitaxially grown over the recessed material. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., a NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further, appropriate wells (not shown) may be formed in the fins 52 and/or the substrate 50. In some embodiments, a p-type well may be formed in the n-type region 50N, and a n-type well may be formed in the p-type region 50P. In some embodiments, p-type well or a n-type well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P. The photoresist can be formed by using a spin-on technique and can be patterned using acceptable photolithography techniques. Once the photoresist is patterned, a n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than about $10^{18}$ cm$^{-3}$, such as in the range of about $10^{16}$ cm$^{-3}$ to about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as in the range of about $10^{16}$ cm$^{-3}$ to about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

In FIG. 3, a dummy dielectric layer 62 is formed on the fins 52. The dummy dielectric layer 62 may be, for example, silicon oxide, silicon nitride, a combination thereof, or the like, and may be deposited or thermally grown according to acceptable techniques. A dummy gate layer 64 is formed over the dummy dielectric layer 62, and a mask layer 66 is formed over the dummy gate layer 64. The dummy gate layer 64 may be deposited over the dummy dielectric layer 62 and then planarized, such as by a CMP. The mask layer 66 may be deposited over the dummy gate layer 64. The dummy gate layer 64 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 64 may be deposited by physical vapor deposition (PVD), CVD, sputter deposition, or other techniques for depositing the selected material. The dummy gate layer 64 may be made of other materials that have a high etching selectivity from the etching of isolation regions, e.g., the STI regions 56 and/or the dummy dielectric layer 62. The mask layer 66 may include one or more layers of, for example, silicon nitride, silicon oxynitride, or the like. In this example, a single dummy gate layer 64 and a single mask layer 66 are formed across the n-type region 50N and the p-type region 50P. In the illustrated embodiment, the dummy dielectric layer 62 covers the STI regions 56, extending over the STI regions 56 and between the dummy gate layer 64 and the STI regions 56. In another embodiment, the dummy dielectric layer 62 covers only the fins 52.

In FIG. 4, the mask layer 66 may be patterned using acceptable photolithography and etching techniques to form masks 76. The pattern of the masks 76 then may be transferred to the dummy gate layer 64 to form dummy gates 74. In some embodiments, the pattern of the masks 76 is also transferred to the dummy dielectric layer 62 by an acceptable etching technique to form dummy dielectrics 72. The dummy gates 74 cover respective channel regions 58 of the fins 52. The pattern of the masks 76 may be used to physically separate each of the dummy gates 74 from adjacent dummy gates 74. The dummy gates 74 may also have a lengthwise direction substantially perpendicular to the lengthwise direction of the fins 52.

FIGS. 5A through 19B illustrate various additional steps in the manufacturing of embodiment devices. FIGS. 5A through 19B illustrate features in either of the n-type region 50N and the p-type region 50P. For example, the structures illustrated in FIGS. 5A through 19B may be applicable to both the n-type region 50N and the p-type region 50P. Differences (if any) in the structures of the n-type region 50N and the p-type region 50P are described in the text accompanying each figure.

Figure 5B:
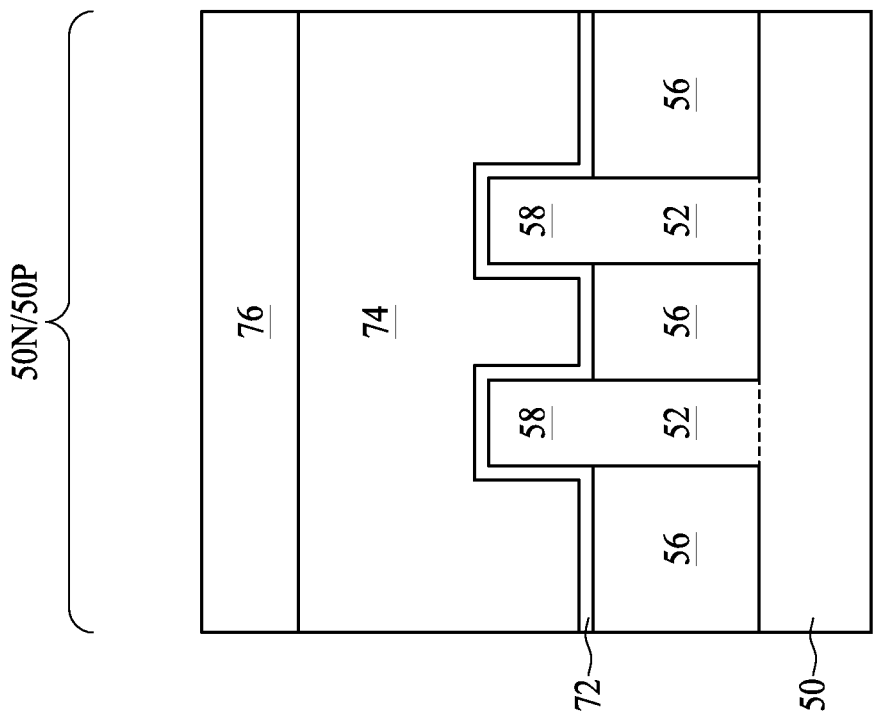
Figure 5A:
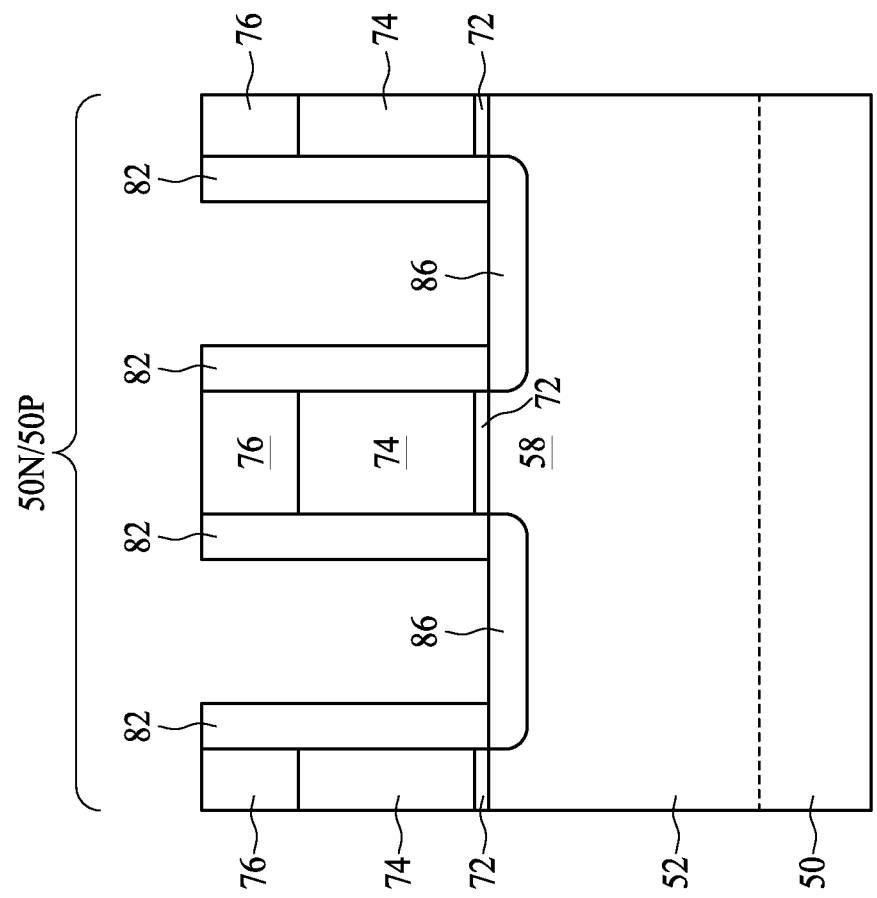

In FIGS. 5A and 5B, gate spacers 82 are formed on sidewalls of the dummy gates 74 and the masks 76. The gate spacers 82 may be formed by conformally depositing one or more insulating material(s) and subsequently etching the insulating material(s). The insulating material(s) may be formed of low-k dielectric materials such as silicon oxide, silicon nitride, silicon carbonitride, silicon oxycarbonitride, a combination thereof, or the like, which may be formed by a conformal deposition process such as chemical vapor deposition (CVD), plasma enhanced chemical vapor deposition (PECVD), atomic layer deposition (ALD), or the like. The insulating material(s), when etched, have portions left on the sidewalls of the dummy gates 74 and the masks 76 (hence forming the gate spacers 82). After the etching, the gate spacers 82 can have straight sidewalls (as illustrated) or can have curved sidewalls (not illustrated). In some embodiments, insulating material(s) of the gate spacers 82 are silicon oxycarbonitride (e.g., $SiO_xN_yC_{1-x-y}$, where x and y are in the range of 0 to 1). For example, each layer of insulating material may have a similar or different composition of silicon oxycarbonitride.

Implants for lightly doped source/drain (LDD) regions 86 may also be performed. In the embodiments with different device types, similar to the implants for the wells previously discussed, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The LDD regions 86 may have a concentration of impurities in the range of about $10^{15}$ cm$^{-3}$ to about $10^{19}$ cm$^{-3}$. An anneal may be used to repair implant damage and to activate the implanted impurities.

Figure 6B:
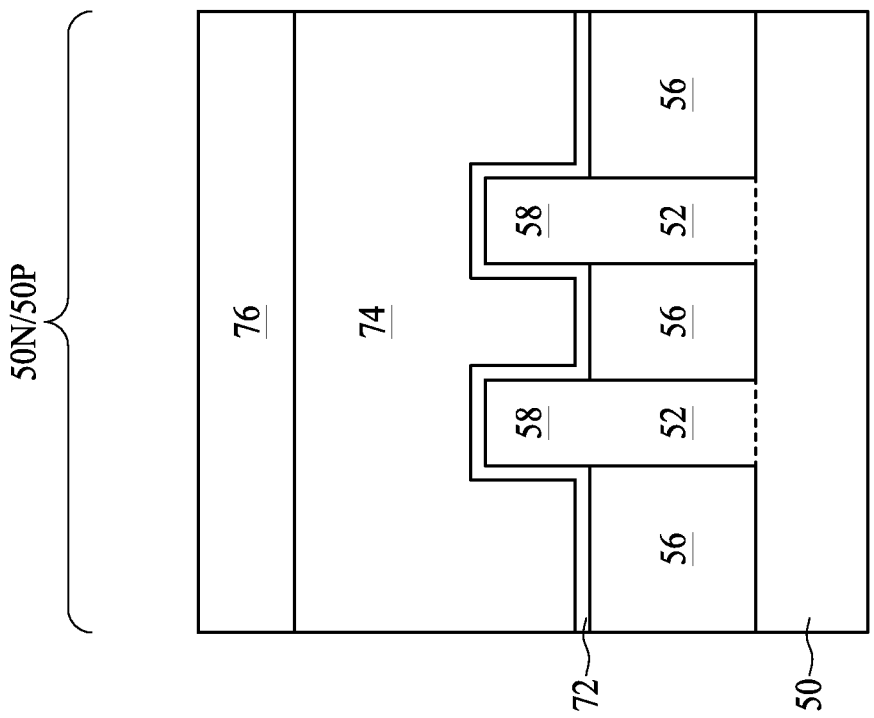
Figure 6A:
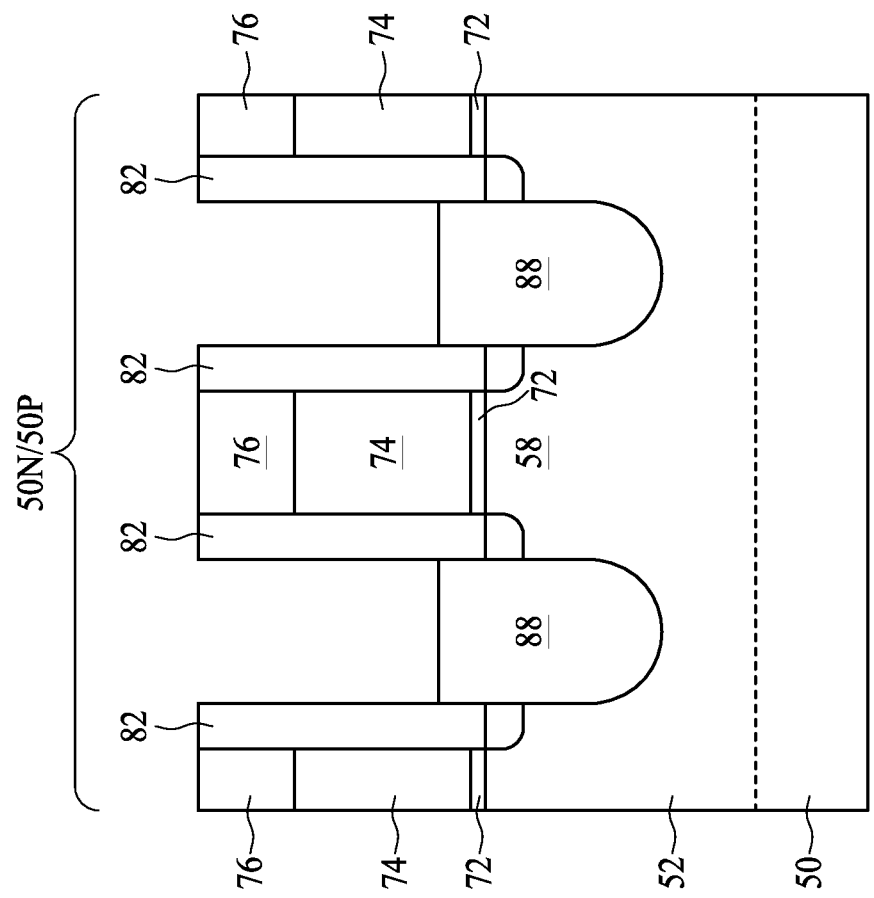
Figure 6C:
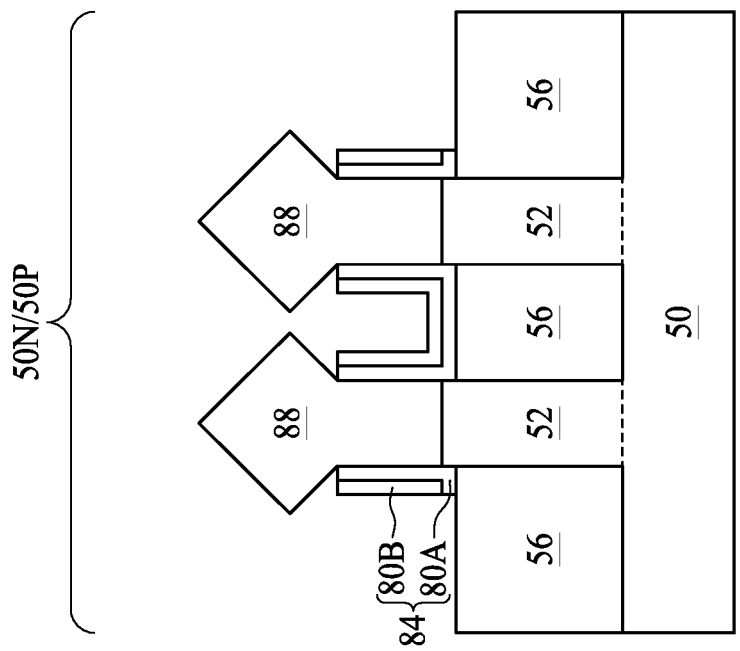
Figure 6D:
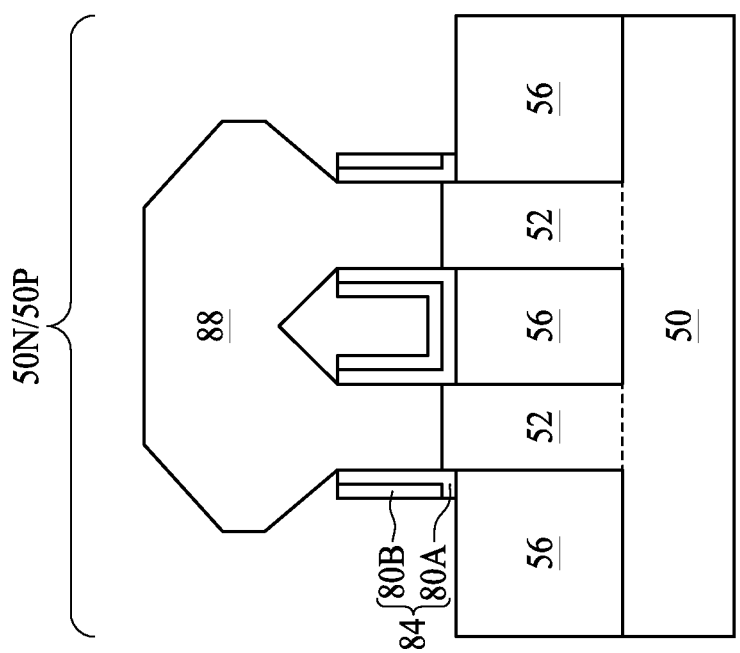

In FIGS. 6A and 6B, epitaxial source/drain regions 88 are formed in the fins 52. The epitaxial source/drain regions 88 are formed in the fins 52 such that each dummy gate 74 is disposed between respective neighboring pairs of the epitaxial source/drain regions 88. In some embodiments the epitaxial source/drain regions 88 may extend into, and may also penetrate through, the fins 52. In some embodiments, the gate spacers 82 are used to separate the epitaxial source/drain regions 88 from the dummy gates 74 by an appropriate lateral distance so that the epitaxial source/drain regions 88 do not short out subsequently formed gates of the resulting FinFETs. A material of the epitaxial source/drain regions 88 may be selected to exert stress in the respective channel regions 58, thereby improving performance.

The epitaxial source/drain regions 88 in the n-type region 50N may be formed by masking the p-type region 50P and etching source/drain regions of the fins 52 in the n-type region 50N to form recesses in the fins 52. The recesses may extend through the LDD regions 86 (see FIG. 5A). Then, the epitaxial source/drain regions 88 in the n-type region 50N are epitaxially grown in the recesses. The epitaxial source/drain regions 88 may include any acceptable material, such as appropriate for n-type FinFETs. For example, if the fins 52 are silicon, the epitaxial source/drain regions 88 in the n-type region 50N may include materials exerting a tensile strain in the channel regions 58, such as silicon, silicon carbide, phosphorous doped silicon carbide, silicon phosphide, or the like. The epitaxial source/drain regions 88 in the n-type region 50N may have surfaces raised from respective surfaces of the fins 52 and may have facets.

The epitaxial source/drain regions 88 in the p-type region 50P may be formed by masking the n-type region 50N and etching source/drain regions of the fins 52 in the p-type region 50P to form recesses in the fins 52. The recesses may extend through the LDD regions 86 (see FIG. 5A). Then, the epitaxial source/drain regions 88 in the p-type region 50P are epitaxially grown in the recesses. The epitaxial source/drain regions 88 may include any acceptable material, such as appropriate for p-type FinFETs. For example, if the fins 52 are silicon, the epitaxial source/drain regions 88 in the p-type region 50P may comprise materials exerting a compressive strain in the channel regions 58, such as silicon-germanium, boron doped silicon-germanium, germanium, germanium tin, or the like. The epitaxial source/drain regions 88 in the p-type region 50P may have surfaces raised from respective surfaces of the fins 52 and may have facets.

The epitaxial source/drain regions 88 and/or the fins 52 may be implanted with dopants to form source/drain regions, similar to the process previously discussed for forming the LDD regions 86, followed by an anneal. The source/drain regions may have an impurity concentration of between about $10^{19}$ cm$^{-3}$ and about $10^{21}$ cm$^{-3}$. The n-type and/or p-type impurities for the source/drain regions may be any of the impurities previously discussed. In some embodiments, the epitaxial source/drain regions 88 may be in situ doped during growth.

As a result of the epitaxy processes used to form the epitaxial source/drain regions 88 in the n-type region 50N and the p-type region 50P, upper surfaces of the epitaxial source/drain regions have facets which expand laterally outward beyond sidewalls of the fins 52. In some embodiments, these facets cause adjacent epitaxial source/drain regions 88 to merge as illustrated by FIG. 6C. In some embodiments, adjacent epitaxial source/drain regions 88 remain separated after the epitaxy process is completed as illustrated by FIG. 6D. The spacer etch used to form the gate spacers 82 may be adjusted to also form fin spacers 84 on sidewalls of the fins 52. In the illustrated embodiment, the fin spacers 84 cover portions of the sidewalls of the fins 52 that extend above the STI regions 56, thereby blocking the epitaxial growth. The fin spacers 84 between adjacent fins 52 may be merged (as shown), or may be separated. In another embodiment, the spacer etch used to form the gate spacers 82 is adjusted to not form the fin spacers 84 on the STI regions 56, so as to allow the epitaxially grown regions to extend to the surface of the STI regions 56.

Figure 7B:
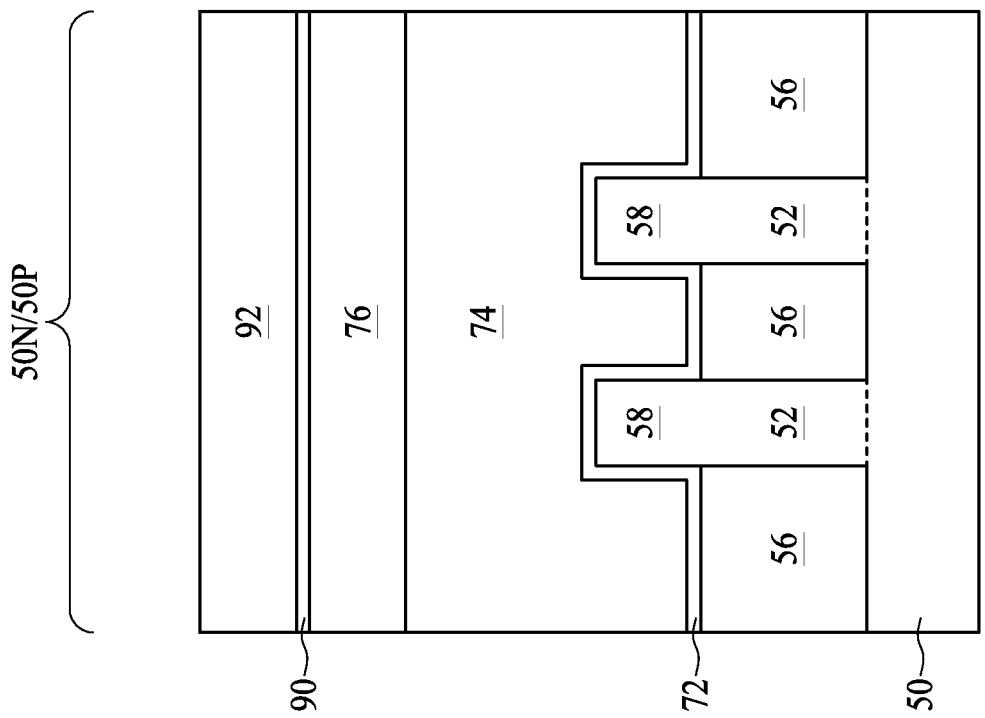
Figure 7A:
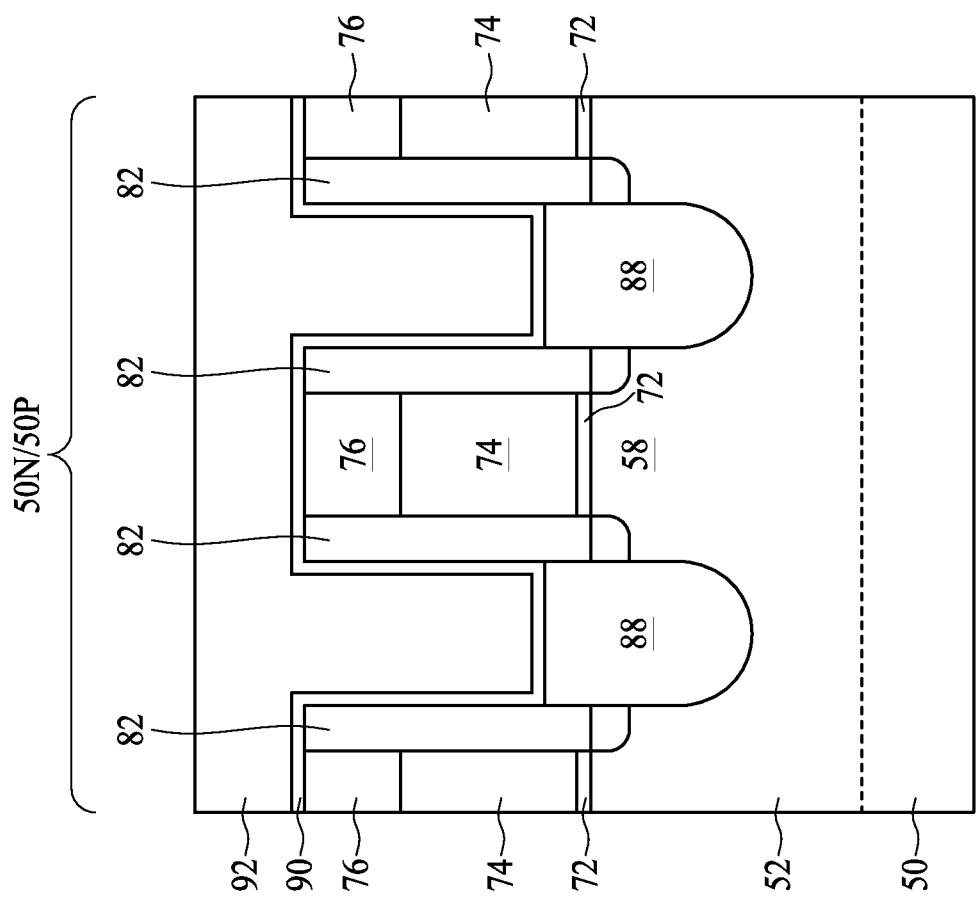

In FIGS. 7A and 7B, a first ILD 92 is deposited over the epitaxial source/drain regions 88, the gate spacers 82, the STI regions 56, and the masks 76 (if present) or the dummy gates 74. The first ILD 92 may be formed of a dielectric material, and may be deposited by any suitable method, such as CVD, plasma-enhanced CVD (PECVD), or FCVD. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 90 is formed between the first ILD 92 and the epitaxial source/drain regions 88, the gate spacers 82, the STI regions 56, and the masks 76 (if present) or the dummy gates 74. The CESL 90 may comprise a dielectric material, such as, silicon nitride, silicon oxide, silicon oxynitride, or the like, having a lower etch rate than the material of the first ILD 92.

Figure 8B:
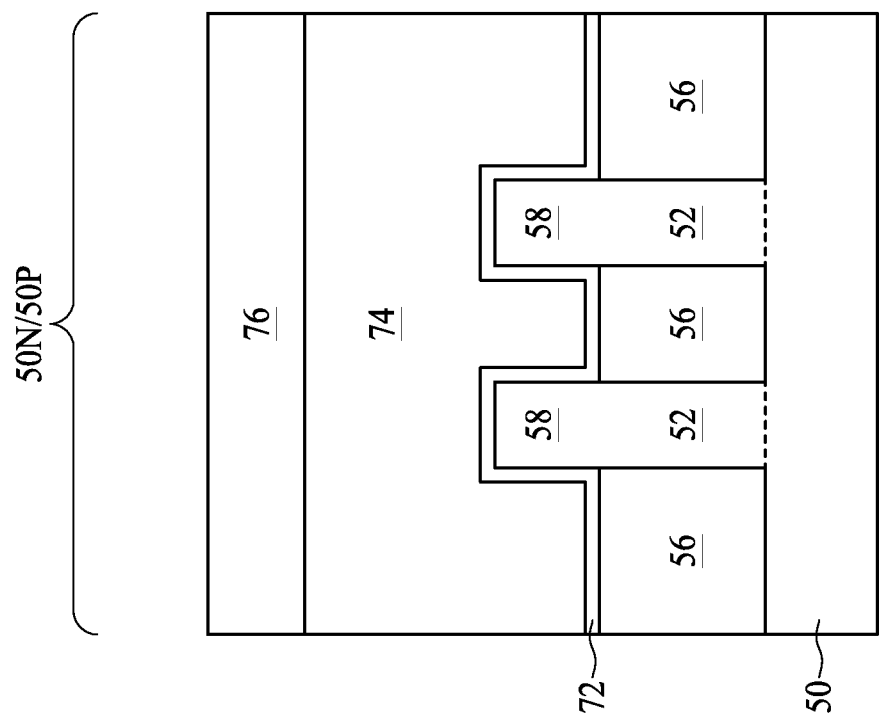
Figure 8A:
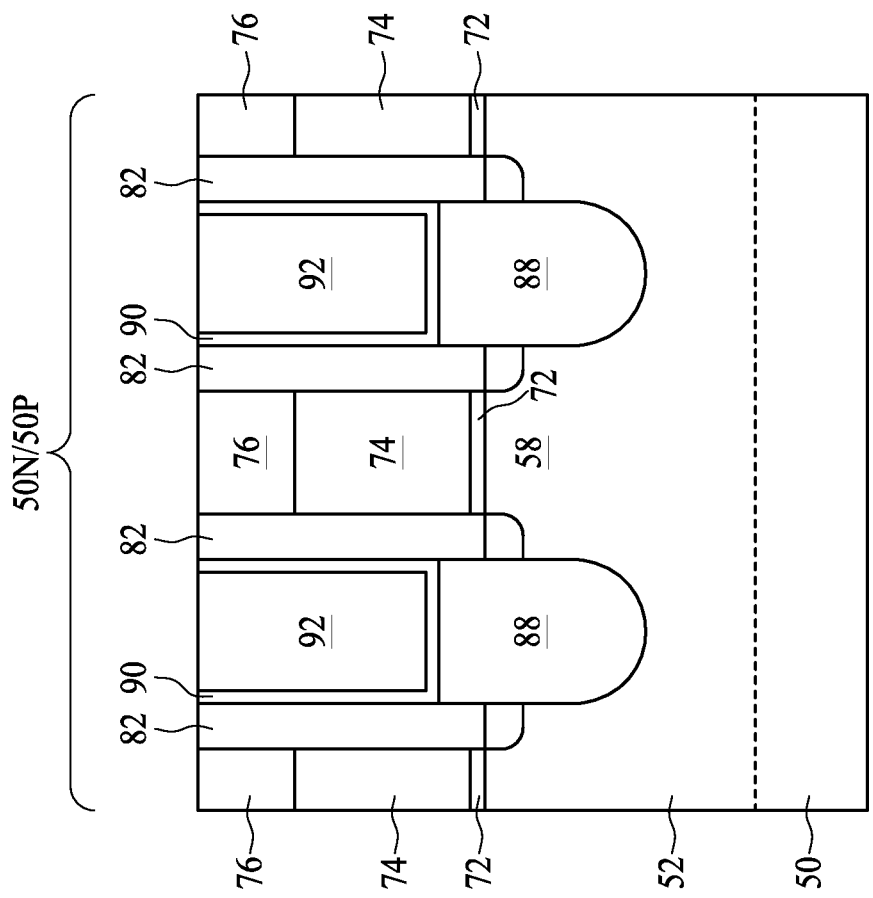

In FIGS. 8A and 8B, a planarization process, such as a CMP, may be performed to level the top surface of the first ILD 92 with the top surfaces of the masks 76 (if present) or the dummy gates 74. The planarization process may also remove the masks 76 on the dummy gates 74, and portions of the gate spacers 82 along sidewalls of the masks 76. After the planarization process, the top surfaces of the dummy gates 74, the gate spacers 82, and the first ILD 92 are coplanar (within process variations). Accordingly, the top surfaces of the dummy gates 74 are exposed through the first ILD 92. In some embodiments, the masks 76 may remain, in which case the planarization process levels the top surface of the first ILD 92 with the top surfaces of the masks 76.

Figure 9B:
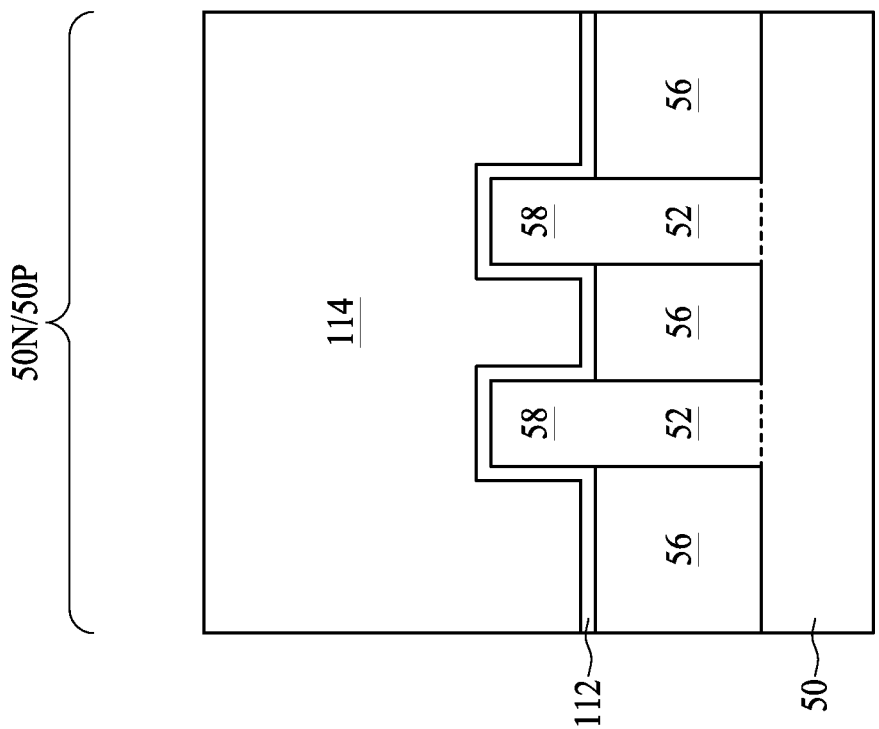
Figure 9A:
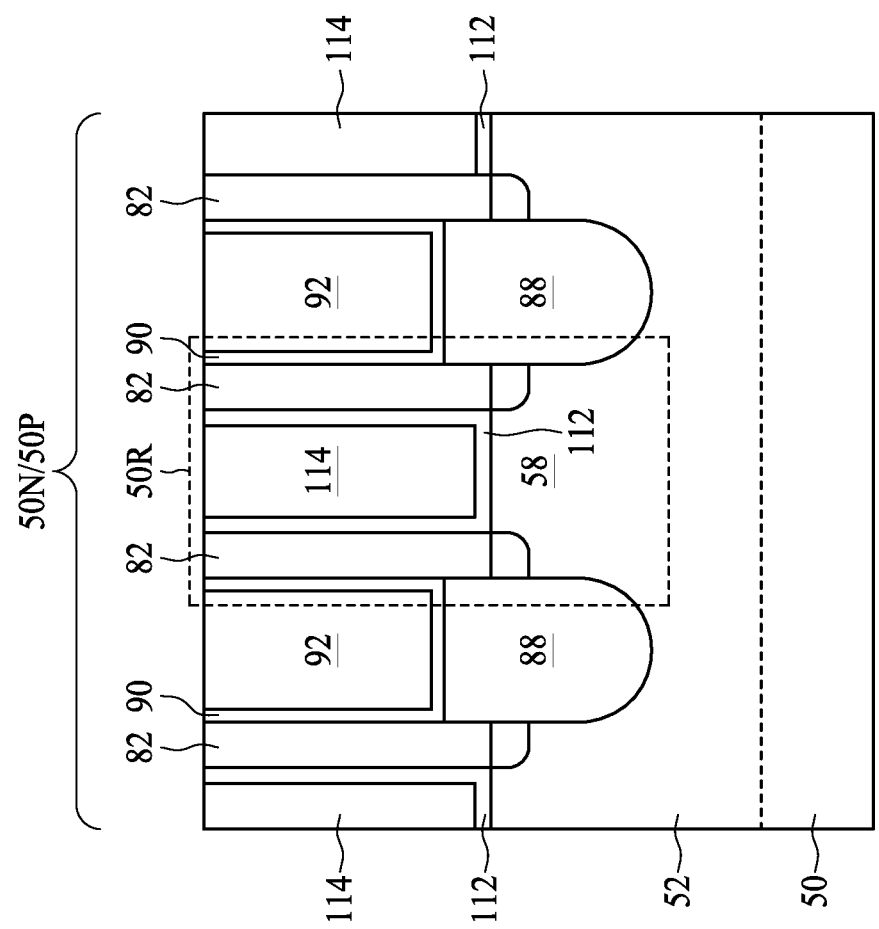

In FIGS. 9A and 9B, the masks 76 (if present) and the dummy gates 74, and optionally the dummy dielectrics 72, are removed and are replaced with replacement gate structures. The replacement gate structures include gate dielectrics 112 and gate electrodes 114. As will be discussed in greater detail below, the replacement gate structures are formed with different channel lengths in different regions, and various treatment processes will be performed during the gate replacement process so that devices with different threshold voltages are formed in the different regions.

FIGS. 10A through 15B are cross-sectional views of intermediate stages in the formation of replacement gate structures, in accordance with some embodiments. Features in regions that are similar to a region 50R in FIG. 9A are illustrated. In the illustrated process, the dummy dielectrics 72 and the dummy gates 74 are replaced. In some embodiments, the dummy dielectrics 72 are removed in a first region of a die (e.g., a core logic region) and remain in a second region of the die (e.g., an input/output region). In other words, the illustrated gate replacement process can be performed in the first region of the die (e.g., the core logic region), and a gate replacement process where the dummy dielectrics 72 are not removed can be performed in the second region of the die (e.g., the input/output region).

FIGS. 10A, 11A, 12A, 13A, and 14A illustrate a dense region 50D, in which replacement gate structures are formed. The gates structures in the dense region 50D have channel regions 58 with short lengths, such as channel lengths of less than about 10 nm. Short channel lengths are desirable for some types of devices, such as devices that operate at high speeds. FIGS. 10B, 11B, 12B, 13B, and 14B illustrate a sparse region 50S, in which replacement gate structures are formed. The gates structures in the sparse region 50S have channel regions 58 with long lengths, such as channel lengths of greater than about 18 nm. Long channel lengths are desirable for some types of devices, such as devices that operate at high power or in applications that require low leakage. More generally, the channel lengths of devices in the dense region 50D are shorter than the channel lengths of devices in the sparse region 50S. Thus, the gate spacers 82 in the dense region 50D are disposed closer to one another than the gate spacers 82 in the sparse region 50S. Further, the gates structures in the dense region 50D have a greater density than the gates structures in the sparse region 50S. The regions 50D, 50S are processed simultaneously and are discussed together. A single fin 52 is illustrated in each of the regions 50D, 50S, but it should be appreciated that each of the regions 50D, 50S can include fins 52 from both of the regions 50N, 50P. In other words, the dense region 50D and the sparse region 50S can each include n-type devices and p-type devices.

Figure 10B:
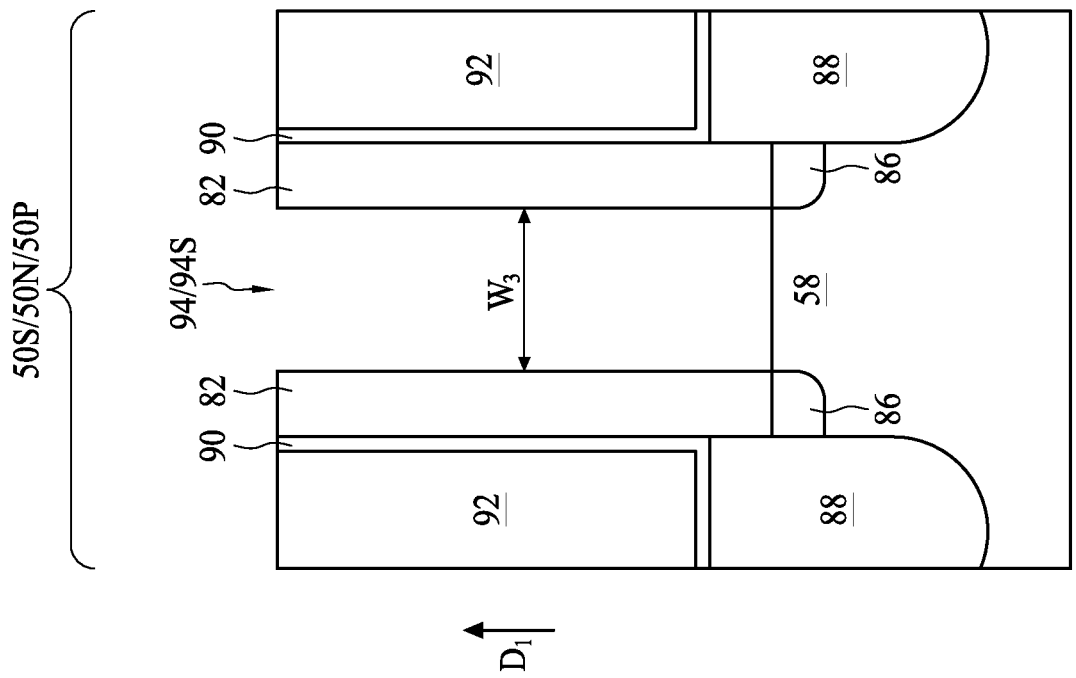
Figure 10A:
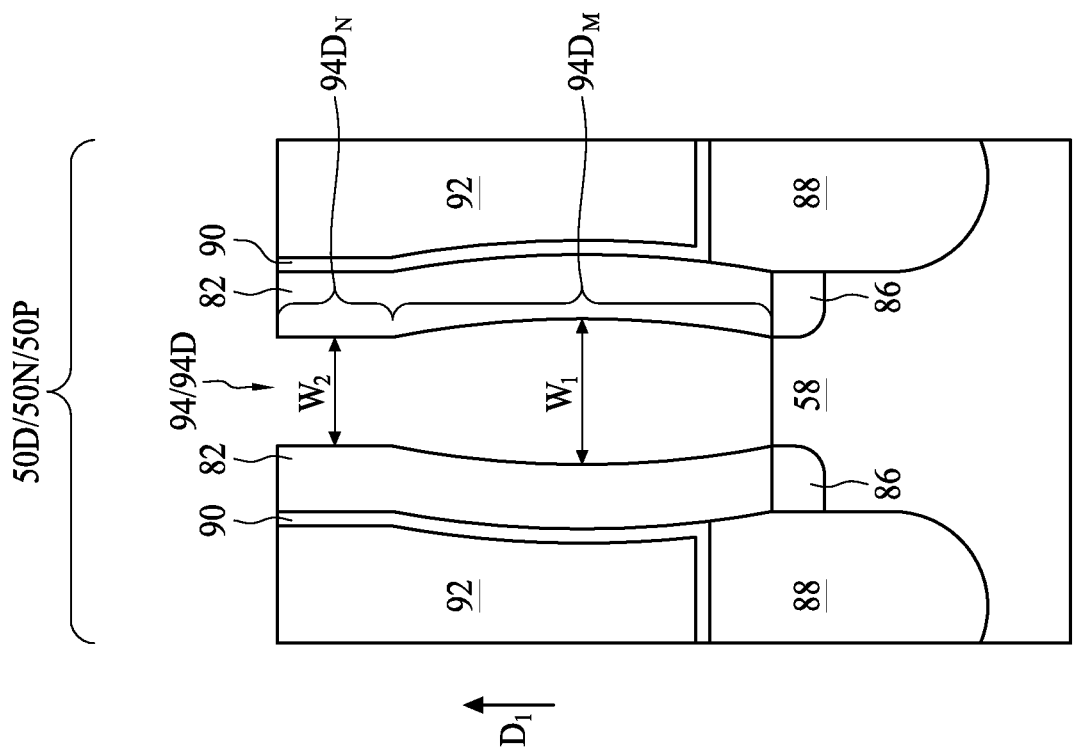

In FIGS. 10A and 10B, the masks 76 (if present) and the dummy gates 74 are removed in one or more etching step(s), so that recesses 94 are formed between opposing portions of the gate spacers 82. The recesses 94 expose the sidewalls of the gate spacers 82. In some embodiments, the dummy gates 74 are removed by an anisotropic dry etch process. For example, the etching process may include a dry etch process using reaction gas(es) that selectively etch the dummy gates 74 at a faster rate than the first ILD 92 or the gate spacers 82. Each recess 94 overlies a channel region 58 of a respective fin 52. During the removal, the dummy dielectrics 72 may be used as etch stop layers when the dummy gates 74 are etched. The dummy dielectrics 72 may then be optionally removed after the removal of the dummy gates 74.

During the patterning of the dummy gates 74, pattern loading effects can cause sidewalls of the portions of the dummy gates 74 proximate the fins 52 to be etched less than sidewalls of the portions of the dummy gates 74 distal the fins 52. The pattern loading effects are more pronounced in the dense region 50D than in the sparse region 50S, and can be exacerbated as technologies scale down (e.g., as aspect ratios of the dummy gates 74 increase). As a result, recesses 94D in the dense region 50D may have a bottle profile shape, while recesses 94S in the sparse region 50S may have a quadrilateral profile shape. In some embodiments, the sidewalls of the gate spacers 82 in the dense region 50D are bowed sidewalls, while the sidewalls of the gate spacers 82 in the sparse region 50S are straight sidewalls (or at least are less bowed than the sidewalls of the gate spacers 82 in the dense region 50D).

The bottle profile shape of the recesses 94D is defined by the widths $W_1$, $W_2$ shown in FIG. 10A. Specifically, the recesses 94D each have main portion $94D_M$ with a first width $W_1$ and a neck portion $94D_N$ with a second width $W_2$. The width $W_1$ can be in the range of about 5 nm to about 30 nm, and the width $W_2$ can be in the range of about 3 nm to about 20 nm. The first width $W_1$ is greater than the second width $W_2$. Further, the first width $W_1$ increases through the main portions $94D_M$ in a direction $D_1$ extending away from the top surfaces of the fins 52 until it reaches a maximal width, and then decreases through the main portions $94D_M$ in the direction $D_1$. The second width $W_2$ may be a constant width through the neck portions $94D_N$ along the direction $D_1$.

The quadrilateral profile shape of the recesses 94S is defined by the width $W_3$ shown in FIG. 10B. Specifically, the recesses 94S each have a single portion with a third width $W_3$. The third width $W_3$ can be in the range of about 20 nm to about 80 nm. The third width $W_3$ is greater than the first width $W_1$ and the second width $W_2$. The third width $W_3$ may be a constant width along a direction $D_1$ extending away from the top surfaces of the fins 52.

Figure 11B:
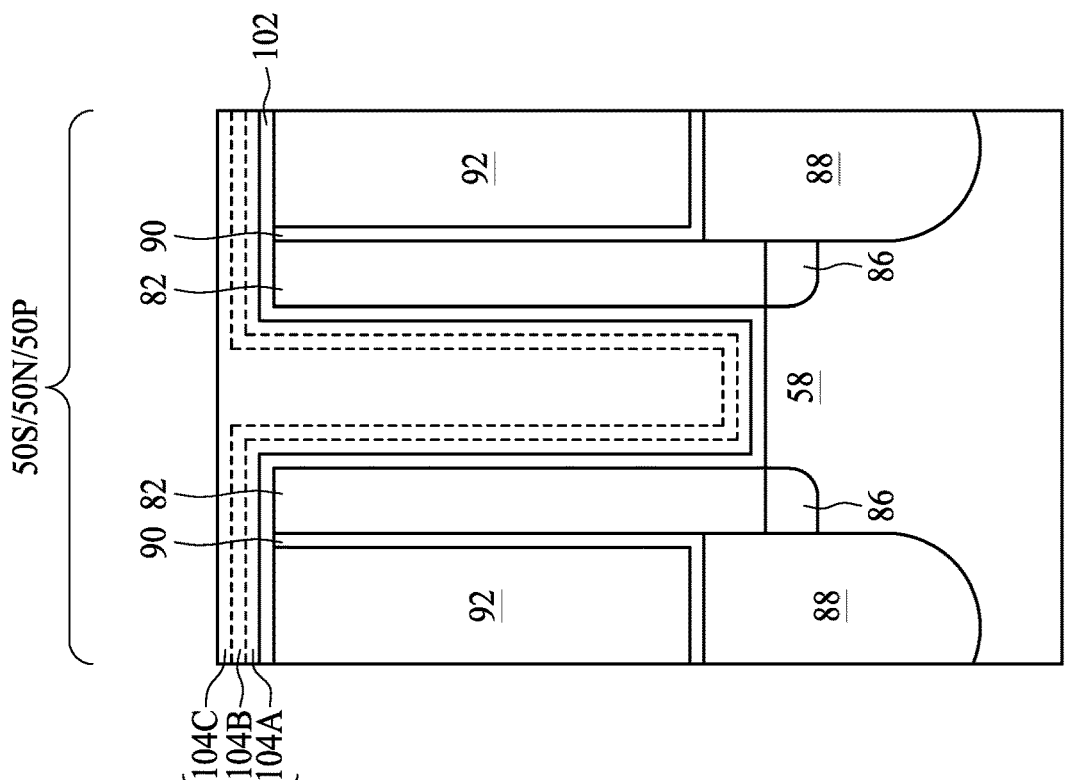
Figure 11A:
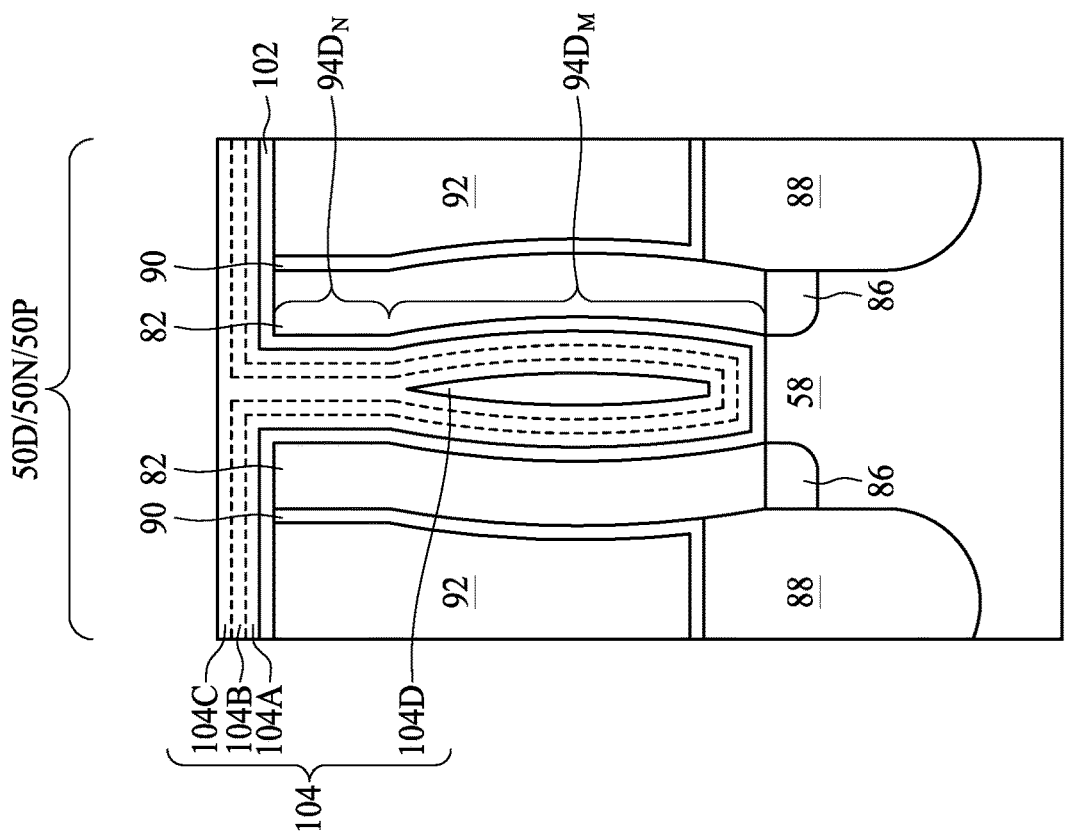

In FIGS. 11A and 11B, a gate dielectric layer 102 and gate electrode layers 104 are deposited in the recesses 94. The gate dielectric layer 102 and the gate electrode layers 104 include a plurality of sub-layers. Example film stack stacks for the gate dielectric layer 102 and the gate electrode layers 104 are shown in FIGS. 29A through 29C, in accordance with various embodiments, and are described in conjunction with FIGS. 11A and 11B.

The gate dielectric layer 102 is deposited in the recesses 94, such as on the top surfaces of the fins 52 and the sidewalls of the gate spacers 82. The gate dielectric layer 102 may also be formed on the top surfaces of the first ILD 92. In some embodiments, the gate dielectric layer 102 includes one or more layers of silicon oxide, silicon nitride, metal oxide, metal silicate, or the like. Although the gate dielectric layer 102 is shown as being single-layered in this embodiment, the gate dielectric layer 102 can include multiple sub-layers in some embodiments. For example, the gate dielectric layer 102 can include an interfacial layer 102A (FIGS. 29A through 29C) of silicon oxide formed by thermal or chemical oxidation and an overlying high-k dielectric material 102B (FIGS. 29A through 29C), such as a metal oxide or a silicate of hafnium, aluminum, zirconium, lanthanum, manganese, barium, titanium, lead, and combinations thereof. The gate dielectric layer 102 may include a dielectric layer having a k-value greater than about 7.0. The formation methods of the gate dielectric layer 102 may include Molecular-Beam Deposition (MBD), ALD, PECVD, and the like. In embodiments where portions of the dummy dielectrics 72 remain in the recesses 94, the gate dielectric layer 102 includes a material of the dummy dielectrics 72 (e.g., silicon oxide).

Optionally, portions of the gate dielectric layer 102 are doped with a dipole-inducing element. For example, a doping layer of a dipole-inducing element can be formed over the gate dielectric layer 102, and an anneal is performed to drive the dipole-inducing element from the doping layer into the gate dielectric layer 102. The doping layer may be formed of an oxide, nitride, or carbide of a dipole-inducing element such as lanthanum, aluminum, scandium, ruthenium, zirconium, erbium, magnesium, strontium, or the like, which may be formed by ALD, CVD, PVD, or other suitable deposition methods. In some embodiments, the doping layer is formed of an oxide of lanthanum, e.g., $LaO_x$. Some embodiments may utilize multiple doping layers. For example, a first doping layer can be formed in a first region (e.g., the dense region 50D) and a second doping layer can be formed in a second region (e.g., the sparse region 50S). The doping layers in the different regions may have different thicknesses and/or include different dipole-inducing elements. The presence, thicknesses, and material of the doping layers can be varied based on the desired threshold voltages of the devices to be formed. For example, doping portions of the gate dielectric layer 102 with lanthanum can decrease the threshold voltages of the devices that are formed with those doped portions of the gate dielectric layer 102. Once the anneal is completed, the gate dielectric layer 102 is doped with the dipole-inducing element (e.g., lanthanum), and the doping layer(s) may then be removed, such as by an acceptable etching process.

The process described above is just one example of how the gate dielectric layer 102 may be formed and doped with a dipole-inducing element. Other techniques may be used to form doped gate dielectric layers. For example, a first gate dielectric sub-layer may be formed, a doping layer deposited over the first gate dielectric sub-layer, and an anneal performed to drive the dipole-inducing element from the doping layer into the first gate dielectric sub-layer. The doping layer may then be removed, and a second gate dielectric sub-layer may be deposited over the first gate dielectric sub-layer. Thus, the first gate dielectric sub-layer may be doped while the second gate dielectric sub-layer is undoped.

The gate electrode layers 104 are deposited over the gate dielectric layer 102 and in the recesses 94. The gate electrode layers 104 may include a metal-containing material such as titanium nitride, titanium oxide, tantalum nitride, tantalum carbide, cobalt, ruthenium, aluminum, tungsten, combinations thereof, or multi-layers thereof. More specifically, the gate electrode layers 104 include any number of work function tuning layers 104A, any number of glue layers 104B, and a fill layer 104C.

The work function tuning layers 104A include any acceptable material to tune a work function of a device to a desired amount given the application of the device to be formed, and may be deposited using any acceptable deposition process. For example, the work function tuning layers 104A may be formed of aluminum, aluminum nitride, titanium aluminide, tantalum aluminum, titanium carbon nitride, or the like, which may be deposited by ALD, CVD, PVD, or the like. In some embodiments, the work function tuning layers 104A are deposited by a conformal process such as ALD, which allows for a more consistent film thickness. In some embodiments, the work function tuning layers 104A are deposited by a non-conformal process such as PVD, which allows for greater manufacturing throughput. Although the work function tuning layers 104A are shown as being single-layered in this embodiment, the work function tuning layers 104A can include multiple sub-layers in some embodiments. For example, the work function tuning layers 104A can include a first tuning layer $104A_1$ (see FIGS. 29A through 29C), may include a second tuning layer $104A_2$ (see FIGS. 29B and 29C), and may further include a third tuning layer $104A_3$ (see FIG. 29C). In some embodiments, only a single work function tuning layer 104A is formed between the glue layers 104B and the fill layer 104C (see FIG. 29A). In some embodiments, a plurality of work function tuning layers 104A are formed between the glue layers 104B and the fill layer 104C (see FIGS. 29B and 29C). The work function tuning layers 104A may be formed based on the desired threshold voltages of the devices.

Different structures for the work function tuning layers 104A can be formed in different regions. As an example to form the work function tuning layers 104A, a first tuning layer $104A_1$ may be deposited in all regions and then etched to remove portions of the first tuning layer $104A_1$ in undesired regions. A second tuning layer $104A_2$ may then be deposited in all regions (and on the first tuning layer $104A_1$) then etched to remove portions of the second tuning layer $104A_2$ in undesired regions. A third tuning layer $104A_3$ may then be deposited in all regions (and on the second tuning layer $104A_2$) then etched to remove portions of the third tuning layer $104A_3$ in undesired regions. Thus, some regions may contain the first tuning layer $104A_1$, other regions may contain the first tuning layer $104A_1$ and the second tuning layer $104A_2$, and still other regions may contain the first tuning layer $104A_1$, the second tuning layer $104A_2$, and the third tuning layer $104A_3$.

One or more capping layers may be formed before the work function tuning layers 104A. In some embodiments, capping layers are deposited, removed (e.g., by etching), and redeposited, which helps remove residual dipole-inducing elements (e.g., lanthanum) that may remain on the top surface of the gate dielectric layer 102. An anneal may be performed after removal of the capping layers and before redeposition of the capping layers, to help with removal of the residual dipole-inducing elements.

The glue layers 104B include any acceptable material to promote adhesion and prevent diffusion. For example, the glue layers 104B may be formed of a metal or metal nitride such as titanium nitride, titanium aluminide, titanium aluminum nitride, silicon-doped titanium nitride, tantalum nitride, or the like, which may be deposited by ALD, CVD, PVD, or the like. In some embodiments, the glue layers 104B are deposited by a conformal process such as ALD, which allows for a more consistent film thickness. In some embodiments, the glue layers 104B are deposited by a non-conformal process such as PVD, which allows for greater manufacturing throughput.

The fill layer 104C includes any acceptable material of a low resistance. For example, the fill layer 104C may be formed of a metal such as tungsten (W), aluminum (Al), cobalt (Co), ruthenium (Ru), combinations thereof or the like, which may be deposited by ALD, CVD, PVD, or the like. In some embodiments, the fill layer 104C is deposited by a conformal process such as ALD, which allows for a more consistent film thickness. In some embodiments, the fill layer 104C is deposited by a non-conformal process such as PVD, which allows for greater manufacturing throughput. As will be discussed in greater detail below, the fill layer 104C completely fills the remaining portions of the recesses 94S, but the fill layer 104C only partially fills the remaining portions of the recesses 94D such that voids 104D are formed.

During deposition of the gate electrode layers 104, pinch-off occurs in the neck portions $94D_N$ of the recesses 94D such that the formation of the gate electrode layers 104 in the recesses 94D is incomplete, thereby forming voids 104D. The gate electrode layers 104 completely fill the neck portions $94D_N$ of the recesses 94D, but the gate electrode layers 104 only partially fill the main portions $94D_M$ of the recesses 94D to define the voids 104D. The voids 104D include the remaining portions of the recesses 94D that are not filled by the gate electrode layers 104. Pinch-off can occur during deposition of any of the work function tuning layers 104A (e.g., the tuning layer $104A_1$, $104A_2$, $104A_3$), the glue layers 104B, or the fill layer 104C. The layer in which pinch-off occurs depends on the width of the recesses 94D, the quantity of layers deposited, and the conformality of the deposition process used to deposit the layers. For example, when less work function tuning layers 104A are formed (e.g., the embodiment of FIG. 29A) or where conformal deposition processes are used, pinch-off can occur later in processing, such as during deposition of the fill layer 104C. Conversely, when more work function tuning layers 104A are formed (e.g., the embodiments of FIGS. 29B and 29C) or where non-conformal deposition processes are used, pinch-off can occur earlier in processing, such as during deposition of the glue layers 104B or one of the work function tuning layers 104A.

In this embodiment, pinch-off occurs during deposition of the fill layer 104C after some of the fill layer 104C is deposited in the main portions $94D_M$ of the recesses 94D. Such pinch-off can occur in embodiments where one work function tuning layer is formed (e.g., the embodiment of FIG. 29A) or where conformal deposition processes are used. Thus, the voids 104D expose surfaces of the fill layer 104C, and the fill layer 104C separates the voids 104D from the glue layers 104B and the work function tuning layers 104A. In such embodiments, the voids 104D are initially formed to have teardrop profile shapes. The teardrop profile shapes of the voids 104D can have a height in the range of about 5 nm to about 80 nm, and a maximal width in the range of about 2 nm to about 8 nm.

Figure 12A:
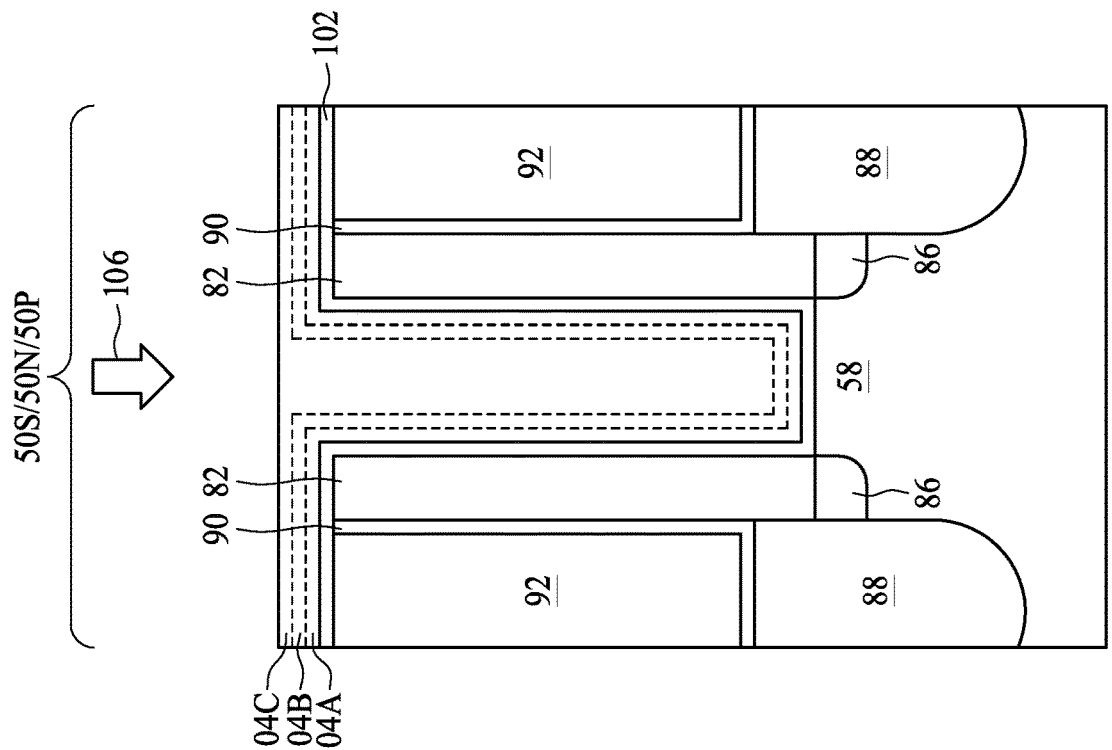
Figure 12B:
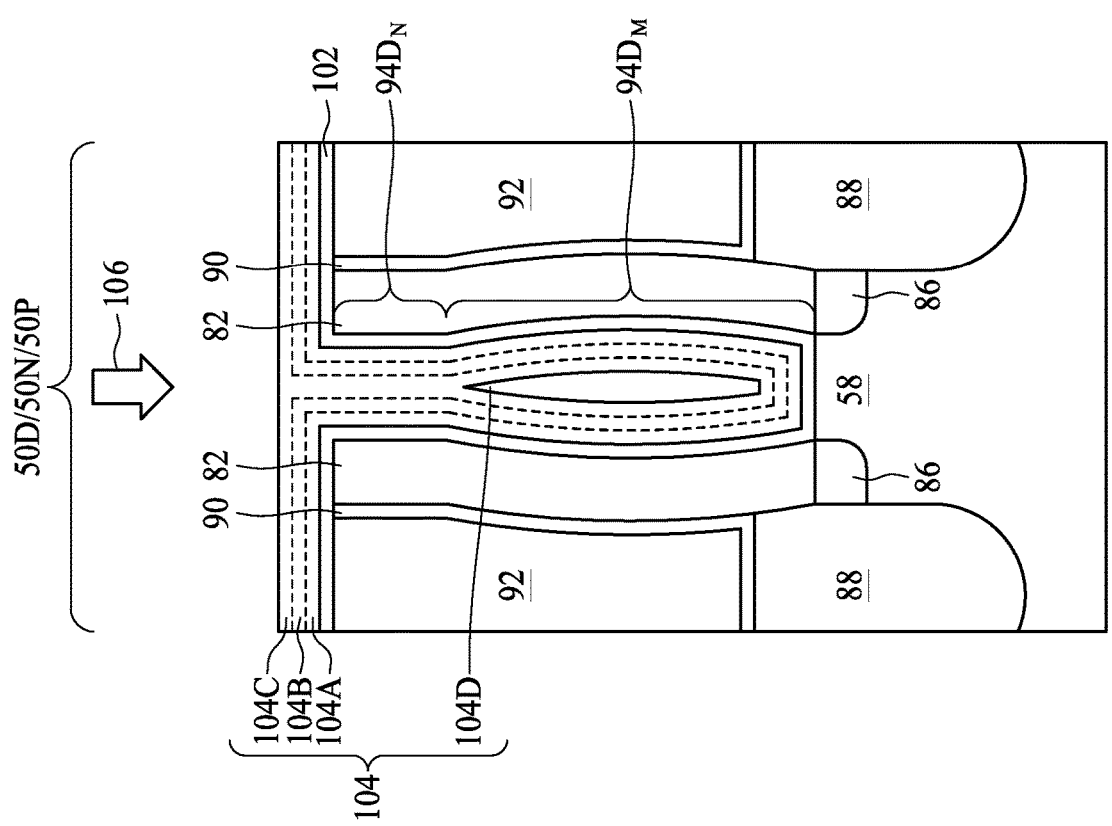

In FIGS. 12A and 12B, a gate treatment process 106 is performed to modify the work functions of the gate electrode layers 104. The gate treatment process 106 incorporates one or more work function tuning elements into one or more of the gate electrode layers 104, which can increase the work function of the gate electrodes 114. The work function tuning elements may also penetrate through the gate electrode layers 104 and be incorporate into the gate dielectric layer 102. The gate treatment process 106 includes a fluorination treatment process (which incorporates fluorine), a nitridation treatment process (which incorporates nitrogen), an oxidation treatment process (which incorporates oxygen), a deposition process (which incorporates chlorine, boron, and/or silicon), combinations thereof, or the like. The type and quantity of the work function tuning elements incorporated by the gate treatment process 106 may be controlled based on the desired threshold voltages of the devices to be formed. For example, incorporation of fluorine can increase the work function of the gate electrode layers 104 for p-type devices, thereby decreasing the threshold voltages of the devices.

In some embodiments, the gate treatment process 106 includes a fluorination treatment process, in which the gate dielectric layer 102 and/or the gate electrode layers 104 are exposed to fluorine. The fluorination treatment process may be performed in a chamber such as an etch chamber. A gas source is dispensed in the chamber. The gas source includes a fluorine source gas and a carrier gas. The fluorine source gas may be fluorine ($F_2$) gas, nitrogen trifluoride ($NF_3$), tungsten(VI) fluoride ($WF_6$), combinations thereof, or the like. The carrier gas may be an inert gas such as argon (Ar), helium (He), xenon (Xe), neon (Ne), krypton (Kr), Radon (Rn), combinations thereof, or the like. In some embodiments, the fluorine source gas is from about 10% to about 50% of the gas source, and the carrier gas is from about 50% to about 90% of the gas source. The gas source may be dispensed at a flow rate of from about 50 sccm to about 1000 sccm. The fluorine in the gas source is incorporated into the gate electrode layers 104 (e.g., the work function tuning layers 104A, the glue layers 104B, and/or the fill layer 104C), thereby changing the work function of the affected gate electrode layers 104. The fluorine in the gas source may also be incorporated into the gate dielectric layer 102, thereby improving the quality of the gate dielectric layer 102. For example, fluorine can passivate oxygen vacancies in the gate dielectric layer 102, decreasing its leakage and increase reliability of the devices. The gas source is kept in the chamber until the gate dielectric layer 102 and/or the gate electrode layers 104 have been fluorinated by a desired amount. In some embodiments, the fluorination treatment process is performed at a temperature of from about 25° C. to about 550° C., and for a duration of from about 10 seconds to about 2700 seconds.

In some embodiments, the gate treatment process 106 includes a nitridation treatment process, in which the gate dielectric layer 102 and/or the gate electrode layers 104 are exposed to nitrogen. The nitridation treatment process may be performed in a chamber such as an etch chamber. A gas source is dispensed in the chamber. The gas source includes a nitrogen source gas and a carrier gas. The nitrogen source gas may be ammonia ($NH_3$), cracked ammonia, a combination of nitrogen ($N_2$) and hydrogen ($H_2$) gas, combinations thereof, or the like. The carrier gas may be an inert gas such as argon (Ar), helium (He), xenon (Xe), neon (Ne), krypton (Kr), Radon (Rn), combinations thereof, or the like. In some embodiments, the nitrogen source gas is from about 10% to about 50% of the gas source, and the carrier gas is from about 50% to about 90% of the gas source. The gas source may be dispensed at a flow rate of from about 500 sccm to about 5000 sccm. In some embodiments, such as when the nitrogen source gas is a combination of $N_2$ and $H_2$, a plasma is generated from the gas source so that nitrogen free radicals and corresponding ions are generated. The nitrogen in the gas source/plasma is incorporated into the gate electrode layers 104 (e.g., the work function tuning layers 104A, the glue layers 104B, and/or the fill layer 104C), thereby changing the work function of the affected gate electrode layers 104. The gas source/plasma is kept in the chamber until the gate dielectric layer 102 and/or the gate electrode layers 104 have been nitrated by a desired amount. In some embodiments, the nitridation treatment process is performed at a temperature of from about 100° C. to about 650° C., and for a duration of from about 10 seconds to about 2700 seconds.

In some embodiments, the gate treatment process 106 includes an oxidation treatment process, in which the gate dielectric layer 102 and/or the gate electrode layers 104 are exposed to oxygen. For example, a low-temperature anneal may be performed in an ambient containing oxygen and an inert gas. The inert gas may be argon (Ar), helium (He), xenon (Xe), neon (Ne), krypton (Kr), Radon (Rn), combinations thereof, or the like. In some embodiments, the oxygen is from about 1% to about 10% of the ambient, and the inert gas is from about 90% to about 99% of the ambient. The low-temperature anneal may be performed at a temperature of from about 150° C. to about 500° C., and for a duration of from about 10 seconds to about 2700 seconds. The oxidation treatment process can also increase reliability of the devices to be formed, such as by densifying the gate electrode layers 104.

In some embodiments, the gate treatment process 106 includes a deposition process, in which the gate dielectric layer 102 and/or the gate electrode layers 104 are exposed to chlorine, boron, and/or silicon. For example, a thin layer containing chlorine, boron, and/or silicon may be deposited on the gate electrode layers 104 by CVD. The deposition process may be performed in a chamber such as a deposition chamber. A gas source is dispensed in the chamber. The gas source includes precursor gas(es) and a carrier gas. The precursor gas(es) may be boron trichloride ($BCl_3$), silane ($SiH_4$), disilane ($Si_2H_6$), diborane ($B_2H_6$), combinations thereof, or the like. The carrier gas may be an inert gas such as argon (Ar), helium (He), xenon (Xe), neon (Ne), krypton (Kr), Radon (Rn), combinations thereof, or the like. In some embodiments, the precursor gas(es) are from about 1% to about 10% of the gas source, and the carrier gas is from about 90% to about 99% of the gas source. The gas source may be dispensed at a flow rate of from about 50 sccm to about 500 sccm. The precursor gas(es) may combine to deposit a layer including the desired elements (e.g., chlorine, boron, silicon, etc.) on the gate electrode layers 104, thereby changing the work function of the affected gate electrode layers 104. The gas source is kept in the chamber until a desired amount of the elements has been deposited on the gate dielectric layer 102 and/or the gate electrode layers 104. In some embodiments, the deposition process is performed at a temperature of from about 300° C. to about 650° C., and for a duration of from about 10 seconds to about 1000 seconds.

Figure 13B:
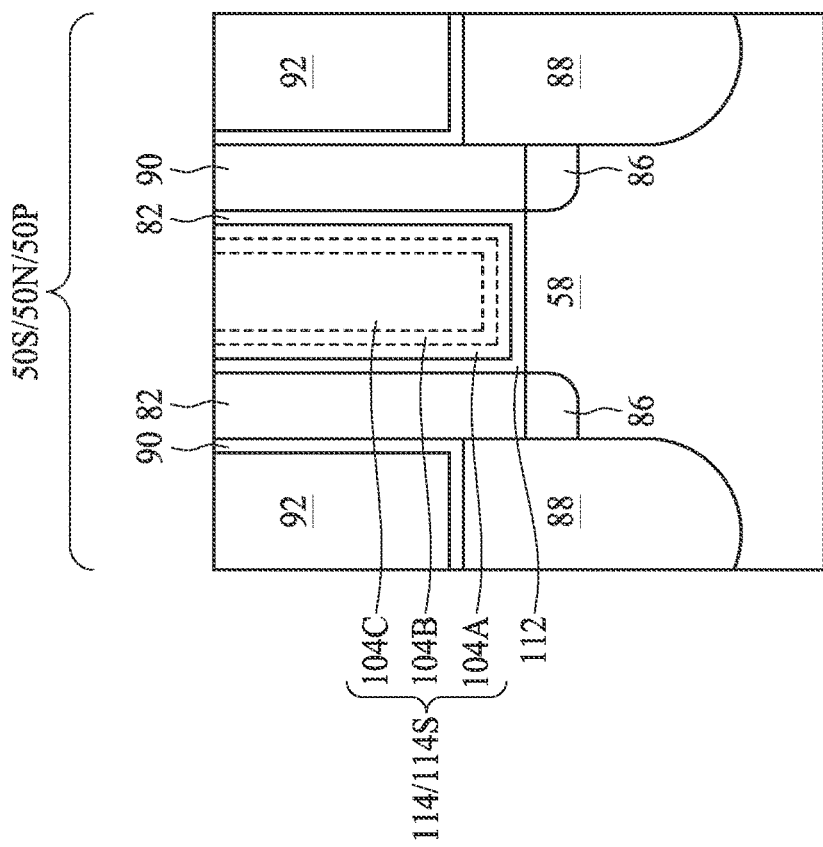
Figure 13A:
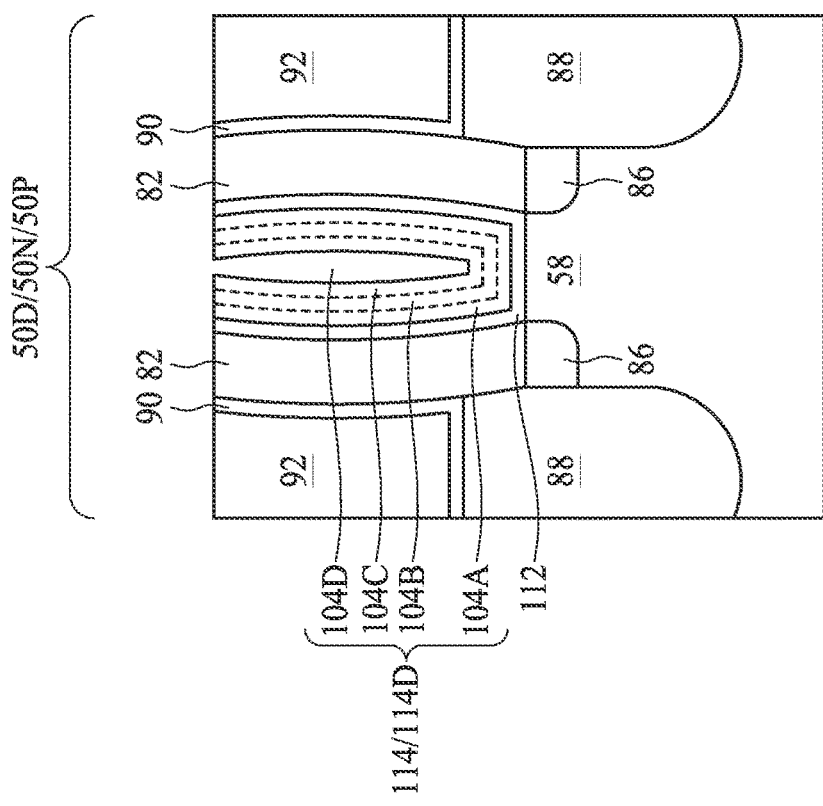

In FIGS. 13A and 13B, a planarization process, such as a CMP, is performed to remove the excess portions of the gate dielectric layer 102 and the gate electrode layers 104, which excess portions are over the top surfaces of the first ILD 92. The remaining portions of the gate dielectric layer 102 in the recesses 94 form gate dielectrics 112. The remaining portions of the gate electrode layers 104 in the recesses 94 form gate electrodes 114. Top surfaces of the gate electrodes 114, the gate dielectrics 112, the first ILD 92, and the gate spacers 82 are coplanar (within process variations) after the planarization process is complete. The gate dielectrics 112 and the gate electrodes 114 form replacement gate structures of the FinFETs. The gate dielectrics 112 and the gate electrodes 114 may each be collectively referred to as a "gate stack." The gate structures extend along sidewalls of a channel region 58 of the fins 52.

The gate electrodes 114D in the dense region 50D have the voids 104D disposed therein. Timed planarization processes may be used to stop the planarizing of the gate dielectric layer 102 and the gate electrode layers 104 after the gate structures reach a desired height. In the illustrated embodiment, the height of the gate structures is controlled so that the voids 104D are breached by the planarization process, which effectively reforms the recesses 94D (see FIGS. 10A and 11A). For example, the planarization process may be performed until the portions of the gate electrode layers 104 in the neck portions $94D_N$ of the recesses 94D (see FIG. 13A) are removed and the voids 104D are exposed at the top surfaces of the gate electrodes 114D, such that the top surfaces of the gate electrodes 114D extend discontinuously between the sidewalls of the gate electrodes 114D. In another embodiment, the height of the gate structures is controlled so that the voids 104D are not breached by the planarization process. For example, the planarization process may be stopped while portions of the gate electrode layers 104 in the neck portions $94D_N$ of the recesses 94D (see FIG. 13A) remain and the voids 104D are not exposed at the top surfaces of the gate electrodes 114S, such that the top surfaces of the gate electrodes 114D extend continuously between the sidewalls of the gate electrodes 114D.

The gate electrodes 114S in the sparse region 50S may not have voids disposed therein. No voids are thus exposed at the top surfaces of the gate electrodes 114S, such that the top surfaces of the gate electrodes 114S extend continuously between the sidewalls of the gate electrodes 114S. In another embodiment, the gate electrodes 114S also have voids, but have smaller voids than the gate electrodes 114D.

Figure 14B:
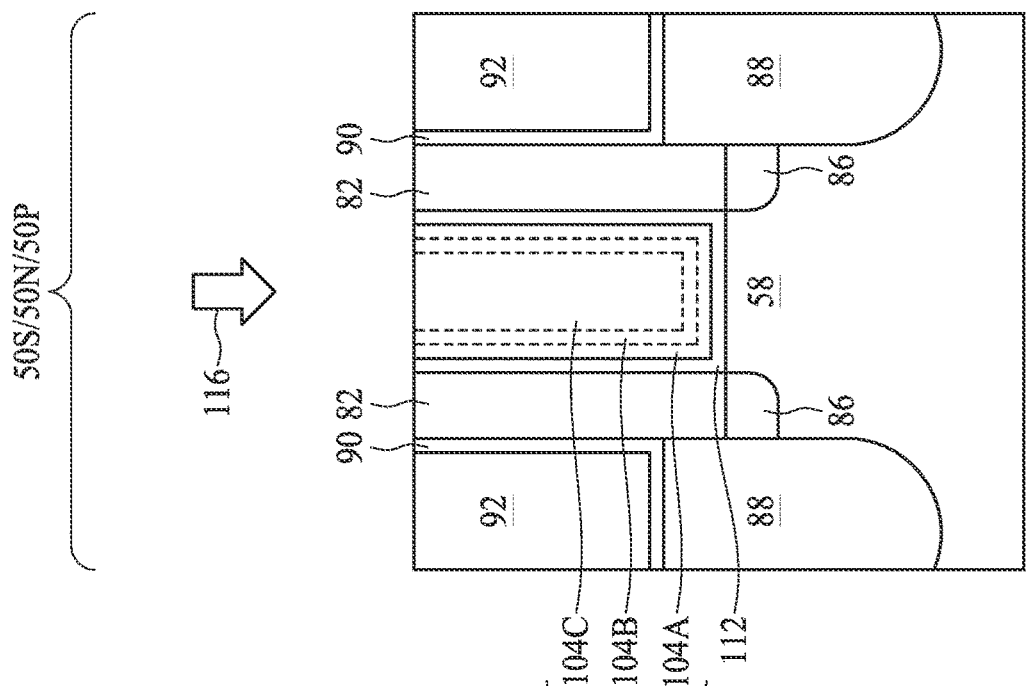
Figure 14A:
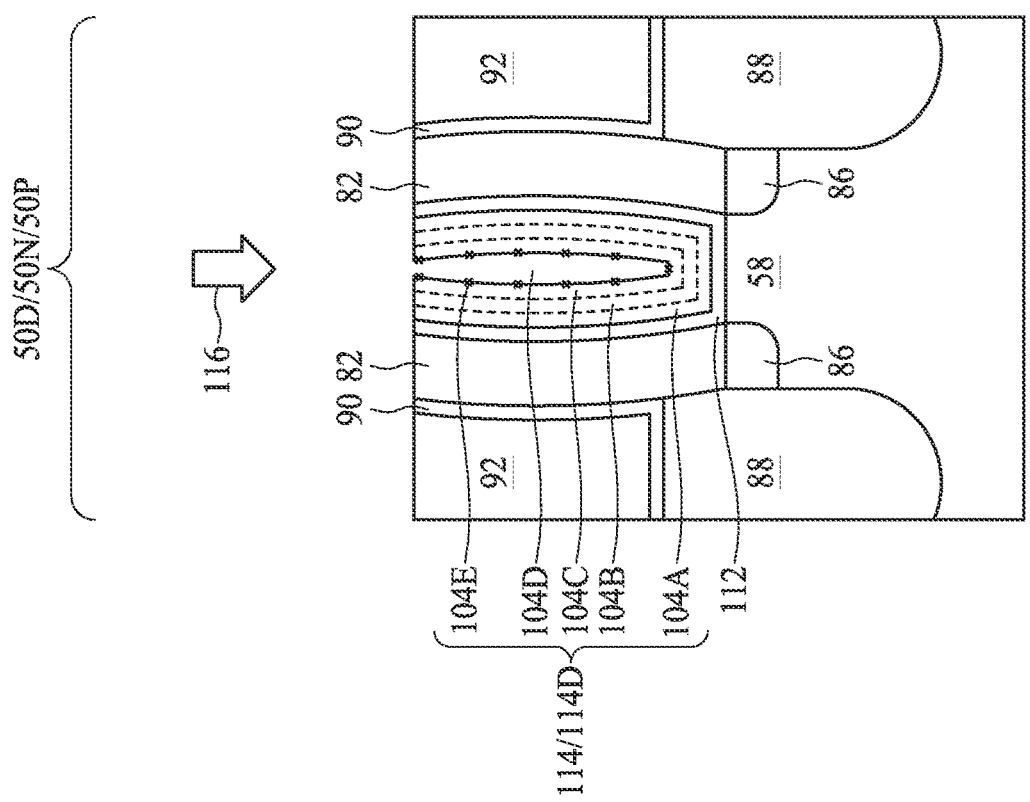

In FIGS. 14A and 14B, a gate treatment process 116 is performed to modify the work functions of the gate electrodes 114. The gate treatment process 116 incorporates one or more work function tuning elements into one or more of the gate electrode layers 104, which can increase the work function of the gate electrodes 114. The gate treatment process 116 may include processes that are selected from the same group of candidate processes of the gate treatment process 106 discussed above for FIGS. 12A and 12B. The gate treatment process 106 and the gate treatment process 116 may be the same process, or may include different processes. For example, performing the gate treatment process 116 may include repeating the gate treatment process 106, or may include performing a different gate treatment process. The type and quantity of the work function tuning elements incorporated by the gate treatment process 116 may be controlled based on the desired threshold voltages of the devices to be formed. For example, incorporation of fluorine can increase the work function of the gate electrodes 114 for p-type devices, thereby decreasing the threshold voltages of the devices.

As noted above, the gate electrodes 114D have voids 104D that may be exposed at the top surfaces of the gate electrodes 114D, while the gate electrodes 114S may not have voids (or at least have smaller voids). When the voids 104D are exposed at the top surfaces of the gate electrodes 114D, the voids 104D expose inner surfaces of the gate electrodes 114D, and the gate treatment process 116 is performed in the voids 104D. Thus, the gate electrodes 114D have more surface area exposed to the gate treatment process 116 than the gate electrodes 114S. As such, the gate treatment process 116 modifies the work functions of the gate electrodes 114D more than it modifies the work functions of the gate electrodes 114S. In some embodiments, the gate treatment process 116 increases the concentration of work function tuning elements in both the gate electrodes 114D and the gate electrodes 114S, but it increase the concentration of work function tuning elements in the gate electrodes 114D by more than it increase the concentration of work function tuning elements in the gate electrodes 114S. In some embodiments, the gate treatment process 116 modifies the work functions of the gate electrodes 114D, while substantially no modification of the work functions of the gate electrodes 114S occurs due to the lack of voids in the gate electrodes 114S. Further, the gate treatment process 116 introduces (or at least increases a concentration of) work function tuning elements 104E at the inner surfaces of the gate electrodes 114D such that the inner surfaces comprise the work function tuning elements 104E. For example, the portions of the gate electrodes 114D near the inner surfaces of the gate electrodes 114D may include the material of the gate electrodes 114D and the work function tuning elements 104E. The gate electrodes 114S may be substantially free of the work function tuning elements 104E.

Figure 15A:
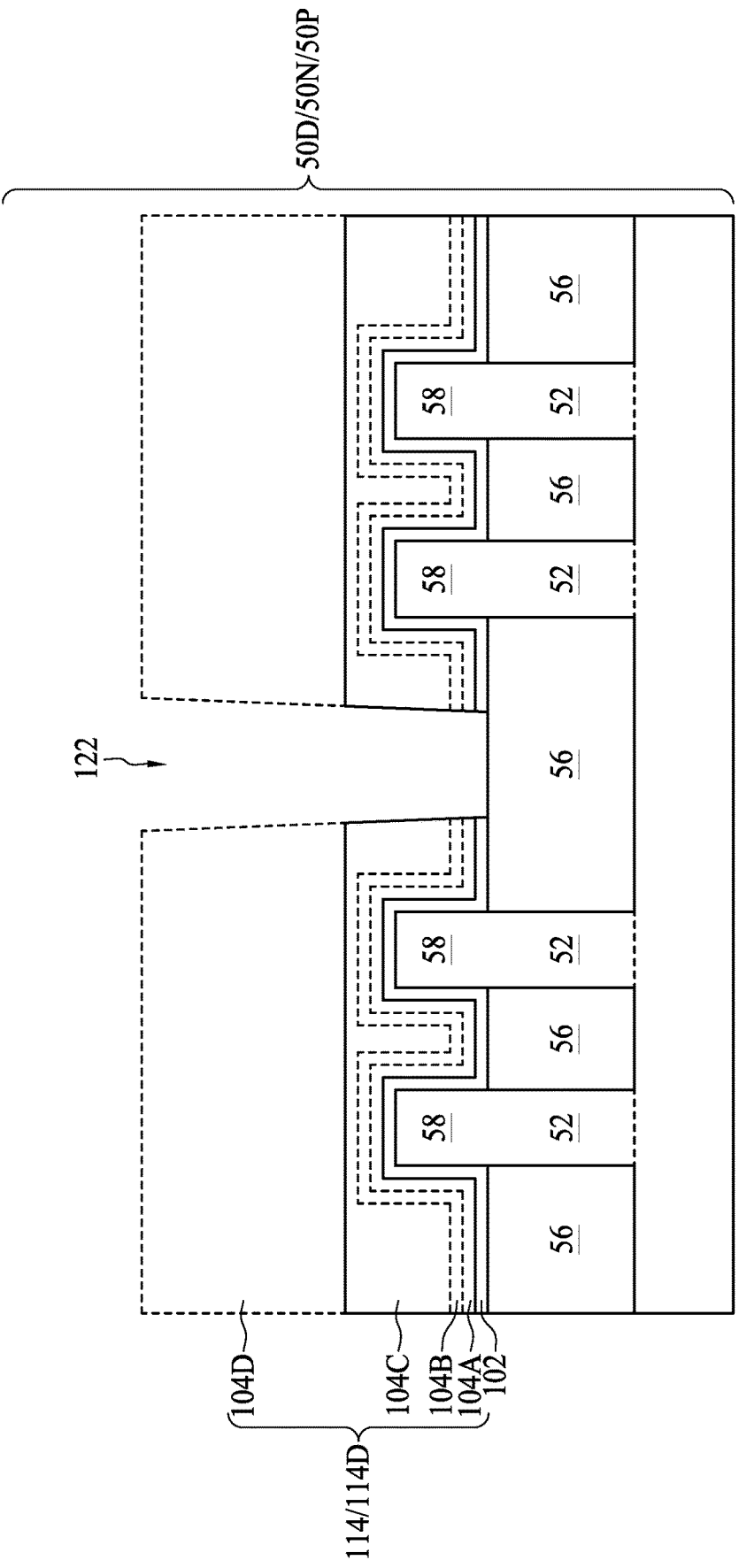
Figure 15B:
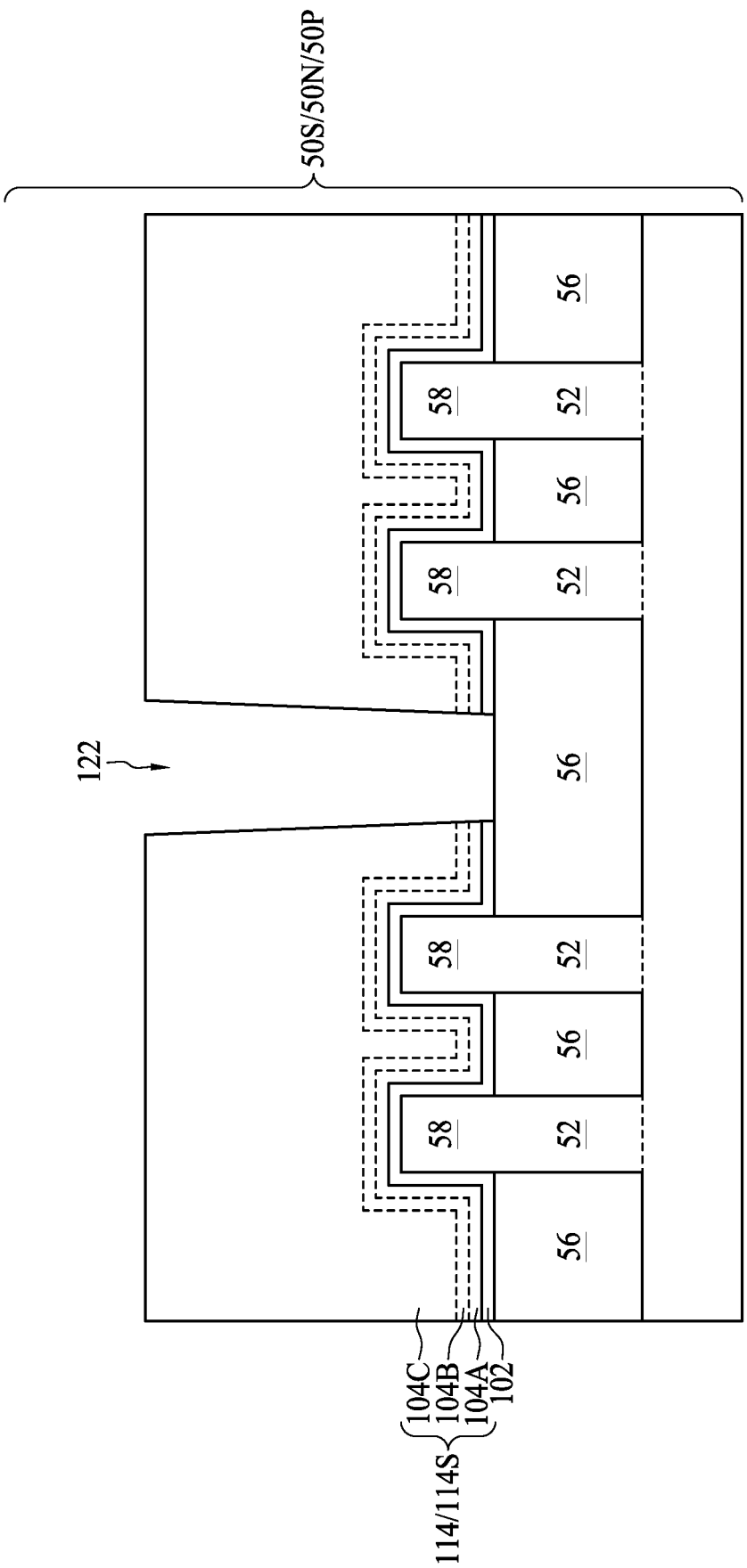
Figure 16A:
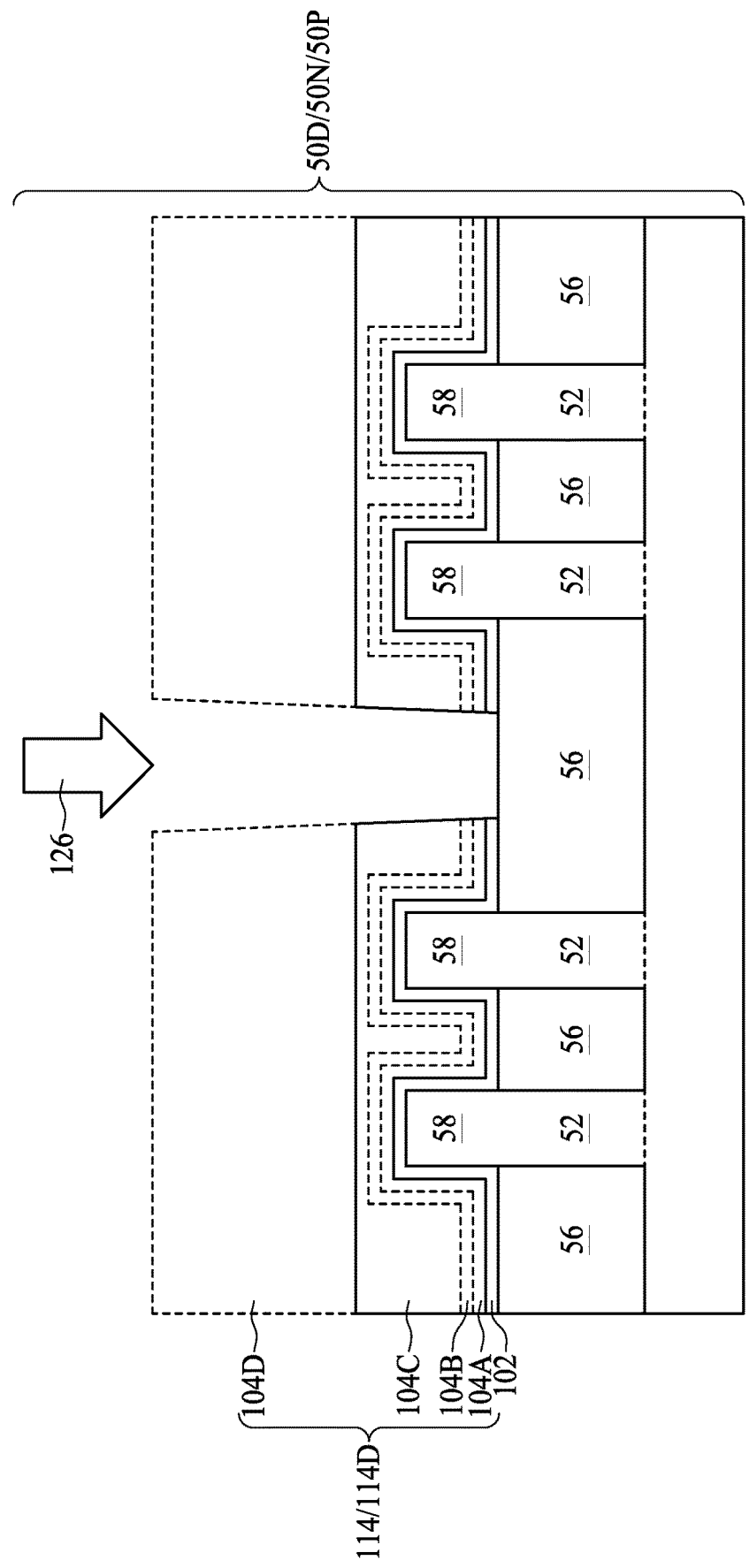
Figure 16B:
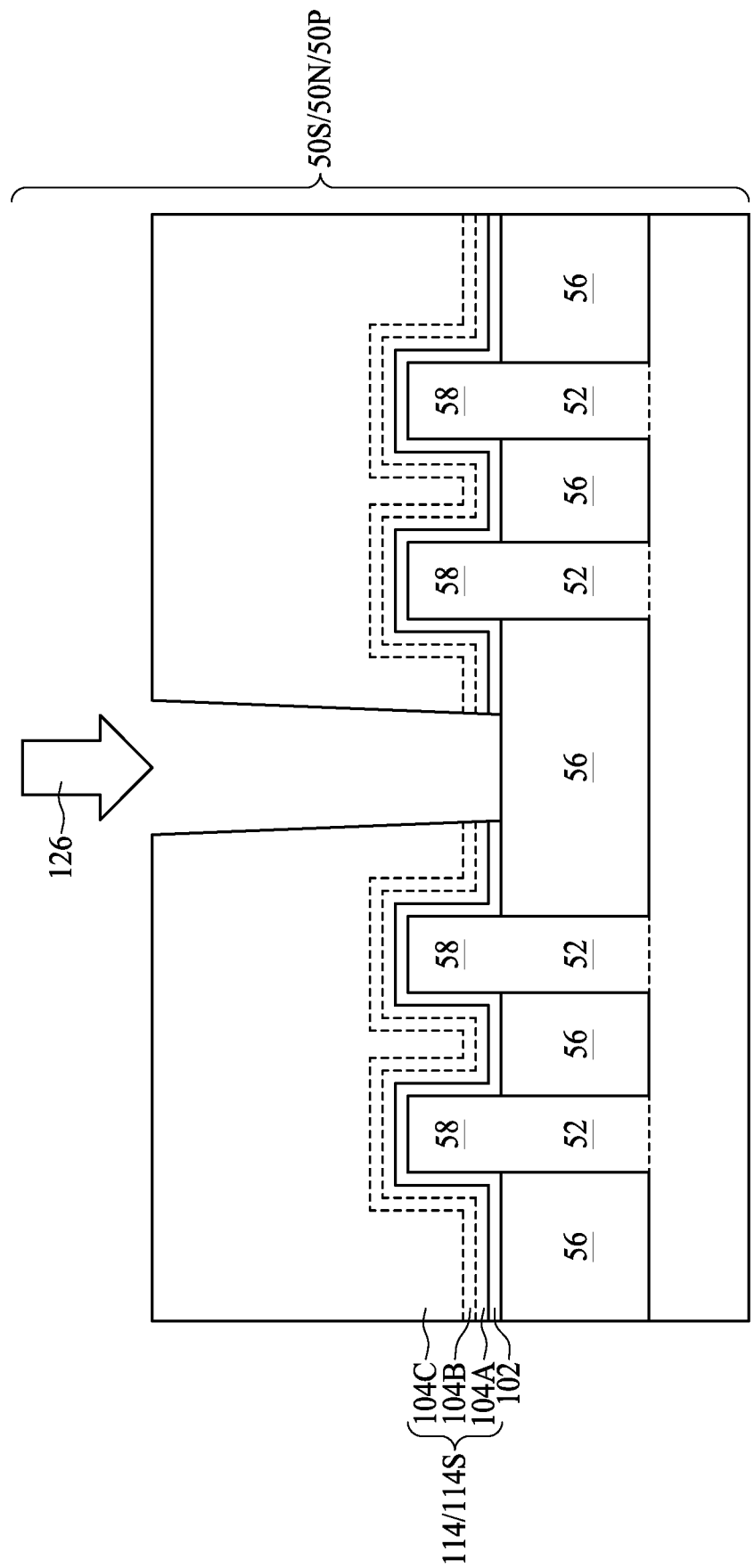
Figure 17A:
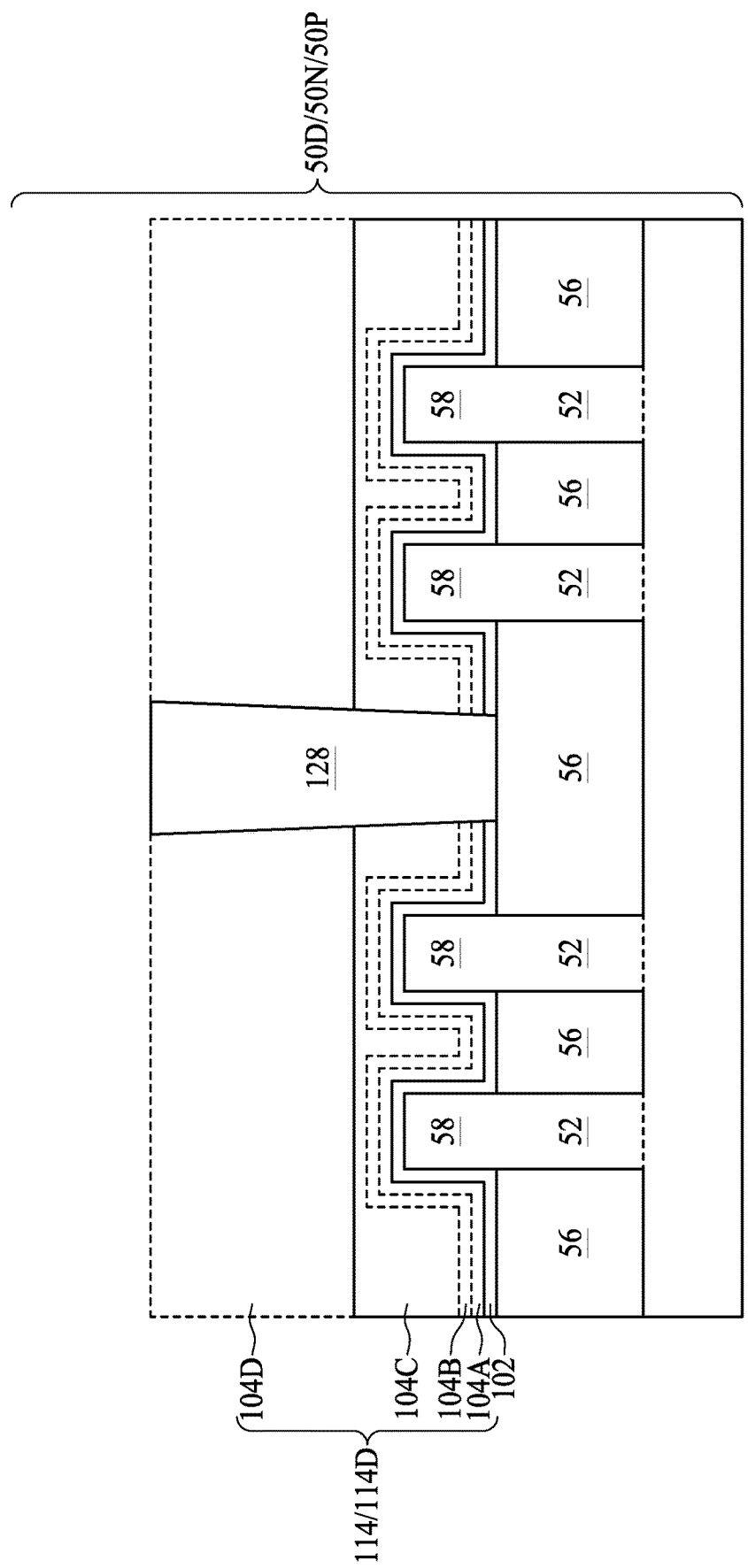
Figure 17B:
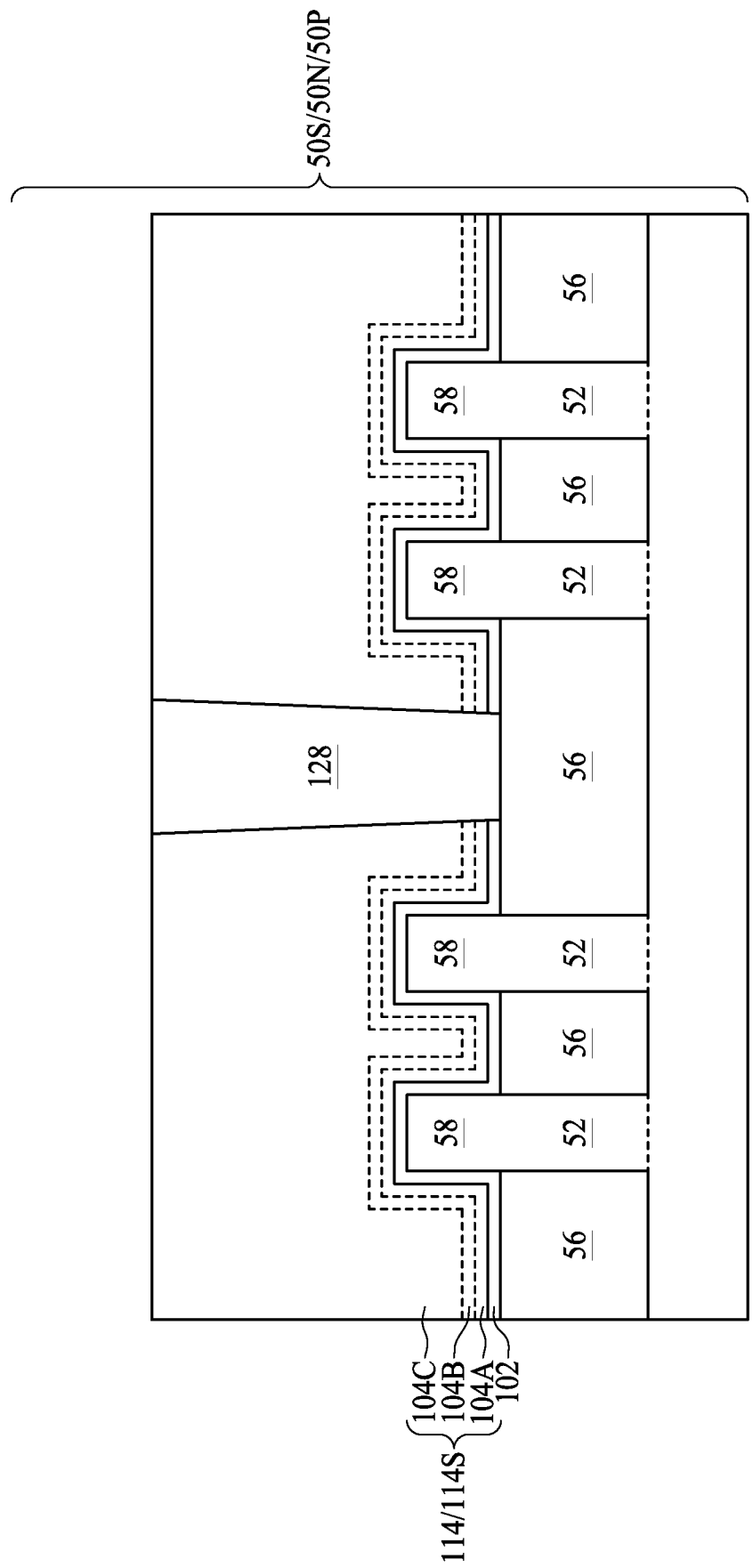

FIGS. 15A through 17B are cross-sectional views of further intermediate stages in the formation of replacement gate structures, in accordance with some embodiments. Features in regions that are similar to FIG. 9B are illustrated, except four gate structures are shown. FIGS. 15A, 16A, and 17A illustrate the dense region 50D, while FIGS. 15B, 16B, and 17B illustrate the sparse region 50S. In the illustrated process, isolation regions are formed to divide the gate electrodes 114. The isolation regions thus separate the gate electrodes 114 that have the same longitudinal axis. The isolation regions provide physical and electrical isolation between the gate electrodes 114 of different devices.

In FIGS. 15A and 15B, openings 122 are formed through the gate electrodes 114. The openings 122 may also be formed through the gate dielectrics 112, in which case the STI regions 56 are exposed. The openings 122 may be formed using acceptable photolithography and etching techniques. The etching may be any acceptable etch process, such as a reactive ion etch (RIE), neutral beam etch (NBE), the like, or a combination thereof, using an etching mask (such as a photoresist) having a pattern of the openings 122. The etch may be anisotropic.

In FIGS. 16A and 16B, a gate treatment process 126 is performed to modify the work functions of the gate electrodes 114. The gate treatment process 126 incorporates one or more work function tuning elements into one or more of the gate electrode layers 104, which can increase the work function of the gate electrodes 114. The gate treatment process 126 may include processes that are selected from the same group of candidate processes of the gate treatment process 106 discussed above for FIGS. 12A and 12B. The gate treatment process 106 and the gate treatment process 126 may be the same process, or may include different processes. For example, performing the gate treatment process 126 may include repeating the gate treatment process 106, or may include performing a different gate treatment process. The type and quantity of the work function tuning elements incorporated by the gate treatment process 126 may be controlled based on the desired threshold voltages of the devices to be formed. For example, incorporation of fluorine can increase the work function of the gate electrodes 114 for p-type devices, thereby decreasing the threshold voltages of the devices.

As noted above, the gate electrodes 114D have voids 104D, while the gate electrodes 114S may not have voids (or at least have smaller voids). The voids 104D expose the inner surfaces of the gate electrodes 114D (see FIG. 14A) so that the gate electrodes 114D have more surface area exposed to the gate treatment process 126 than the gate electrodes 114S. The openings 122 provide an additional inlet to the voids 104D at the ends of the gate electrodes 114D. As such, the voids 104D may be exposed at the top surfaces and/or the sidewalls of the gate electrodes 114D, thereby increasing the opportunities for the gate treatment process 126 to treat the inner surfaces of the gate electrodes 114D. Further, forming the openings 122 can allow the voids 104D to be exposed at the sidewalls of the gate electrodes 114D when the voids 104D are not exposed at the top surfaces of the gate electrodes 114D. Similar to the gate treatment process 116 discussed above for FIGS. 14A and 14B, the gate treatment process 126 modifies the work functions of the gate electrodes 114D more than it modifies the work functions of the gate electrodes 114S. In some embodiments, the gate treatment process 126 increases the concentration of work function tuning elements in both the gate electrodes 114D and the gate electrodes 114S, but it increase the concentration of work function tuning elements in the gate electrodes 114D by more than it increase the concentration of work function tuning elements in the gate electrodes 114S. In some embodiments, the gate treatment process 126 modifies the work functions of the gate electrodes 114D, while substantially no modification of the work functions of the gate electrodes 114S occurs due to the lack of voids in the gate electrodes 114S. Further, the gate treatment process 126 introduces (or at least increases a concentration of) the work function tuning elements 104E (see FIG. 14A) at the inner surfaces of the gate electrodes 114D. For example, the portions of the gate electrodes 114D near the inner surfaces of the gate electrodes 114D may include the material of the gate electrodes 114D and the work function tuning elements 104E. The gate electrodes 114S may be substantially free of the work function tuning elements 104E.

In the illustrated embodiment, both of the gate treatment processes 116, 126 are performed. One of the gate treatment processes 116, 126 may be omitted. In some embodiments, the gate treatment process 116 is performed and the gate treatment process 126 is omitted. In some embodiments, the gate treatment process 126 is performed and the gate treatment process 116 is omitted. The gate treatment processes 116, 126 can be included or omitted based on whether the voids 104D are exposed at the top surfaces of the gate electrodes 114D. For example, the gate treatment process 116 can be performed and the gate treatment process 126 can be omitted when the voids 104D are exposed at the top surfaces of the gate electrodes 114D, or the gate treatment process 126 can be performed and the gate treatment process 116 can be omitted when the voids 104D are not exposed at the top surfaces of the gate electrodes 114D. The gate treatment processes 116, 126 can also be included or omitted based on the desired work function tuning element concentration (and thus threshold voltages) of the devices to be formed. As noted above, substantially no modification of the work functions of the gate electrodes 114S may occur as a result of gate treatment processes 116, 126. In embodiments where the gate treatment processes 116, 126 are both performed, the gate electrodes 114D can have a concentration of work function tuning elements (e.g., fluorine, nitrogen, oxygen, chlorine, boron, silicon, etc.) in the range of about 1 at. % to about 28 at. %, such as a concentration of at least $5 \times 10^{16}$ cm$^{-3}$, while the gate electrodes 114S can have a concentration of the work function tuning elements that is substantially zero. Including the work function tuning elements in the gate electrodes 114D, 114S to concentrations in such ranges may allow for the formation of devices with sufficiently different (e.g., distinguishable) threshold voltages. Including the work function tuning elements in the gate electrodes 114D, 114S to concentrations outside of such ranges may not allow for the formation of devices with sufficiently different (e.g., distinguishable) threshold voltages.

In FIGS. 17A and 17B, an insulation material is formed in the openings 122 to form isolation regions 128. The isolation regions 128 provide isolation between the gate electrodes 114. The insulation material may be an oxide, such as silicon oxide, a nitride, the like, or a combination thereof, and may be formed by a HDP-CVD, FCVD (e.g., a CVD-based material deposition in a remote plasma system and post curing to make it convert to another material, such as an oxide), the like, or a combination thereof. Other insulation materials formed by any acceptable process may be used. The insulation material of the isolation regions 128 may be the same as the insulation material of the STI regions 56, or may be a different insulation material. In the illustrate embodiment, the insulation material is silicon nitride.

Figure 18B:
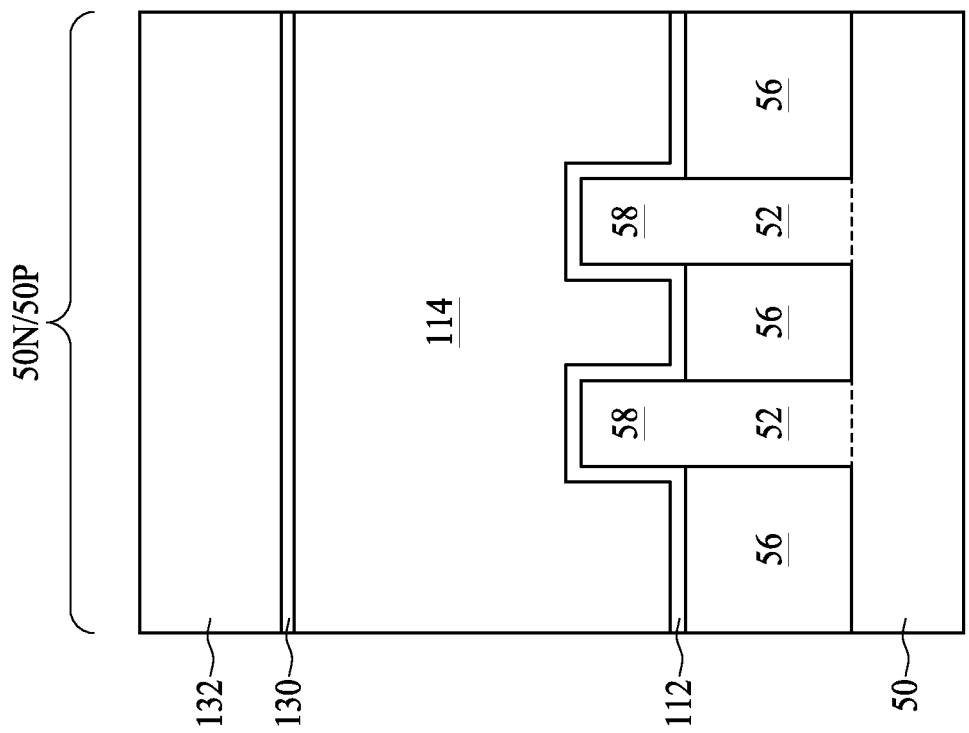
Figure 18A:
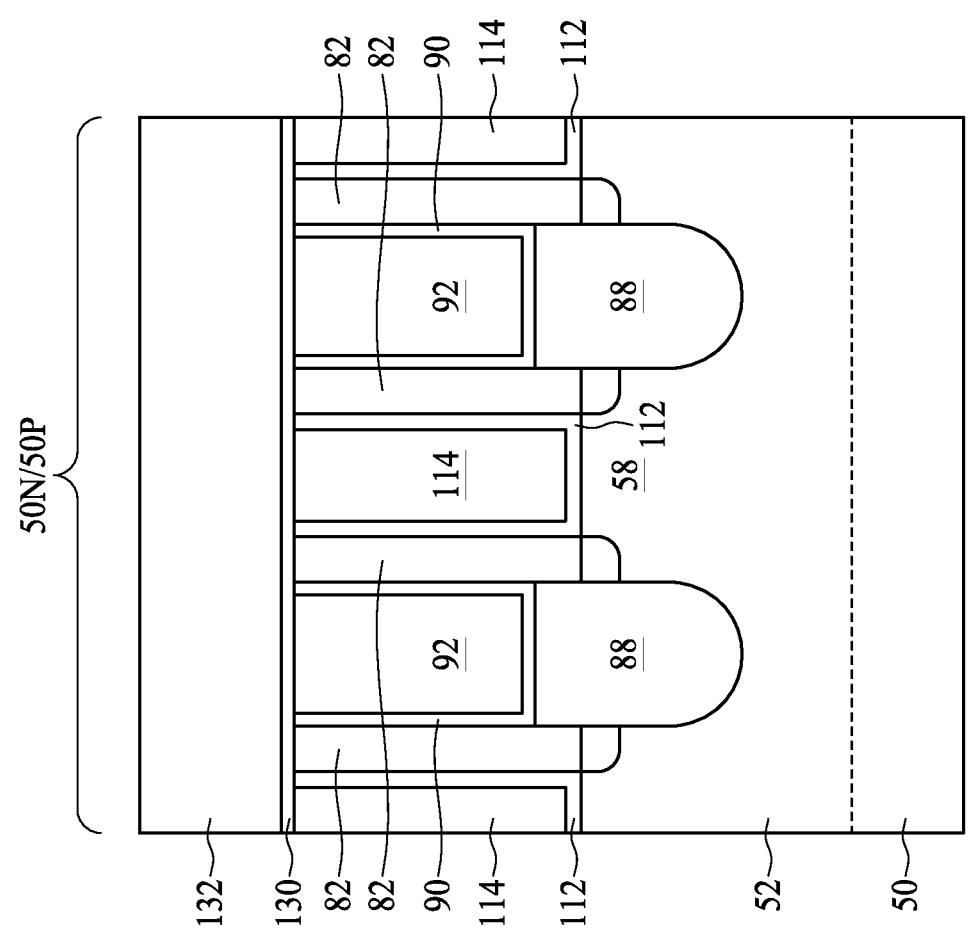

In FIGS. 18A and 18B, a second ILD 132 is deposited over the gate spacers 82, the CESL 90, the first ILD 92, the gate dielectrics 112, and the gate electrodes 114. In some embodiments, the second ILD 132 is a flowable film formed by a flowable CVD method. In some embodiments, the second ILD 132 is formed of a dielectric material such as PSG, BSG, BPSG, USG, or the like, and may be deposited by any suitable method, such as CVD and PECVD.

In some embodiments, an etch stop layer (ESL) 130 is formed between the second ILD 132 and the gate spacers 82, the CESL 90, the first ILD 92, the gate dielectrics 112, and the gate electrodes 114. The ESL 130 may include a dielectric material, such as, silicon nitride, silicon oxide, silicon oxynitride, or the like, having a high etching selectivity from the etching of the second ILD 132.

Figure 19B:
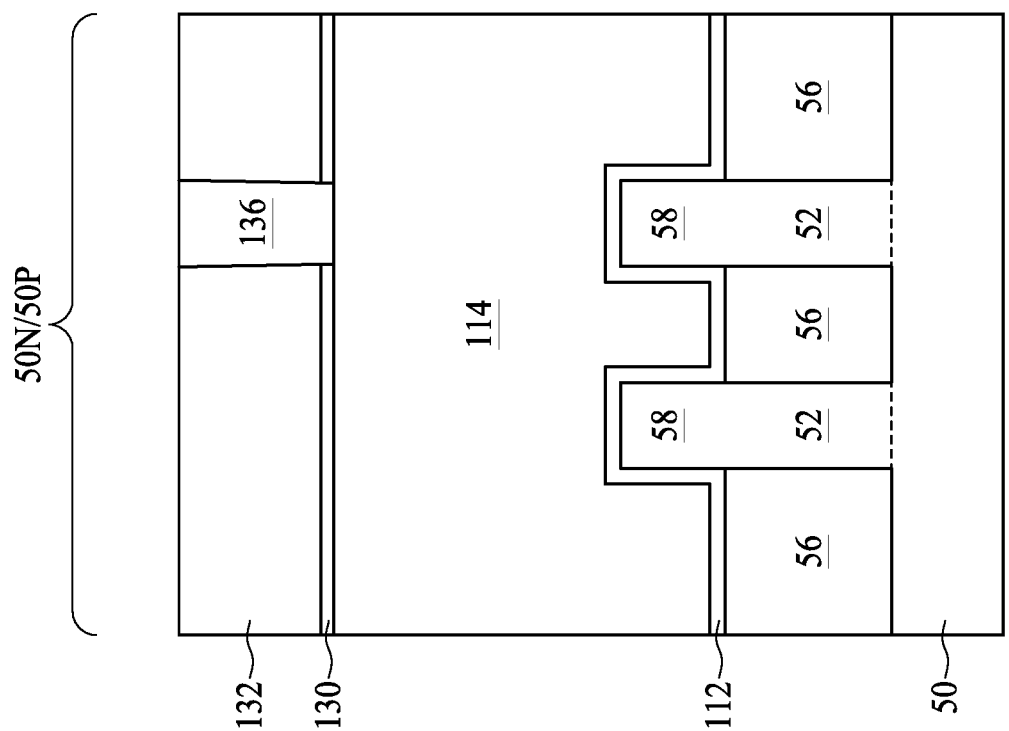
Figure 19A:
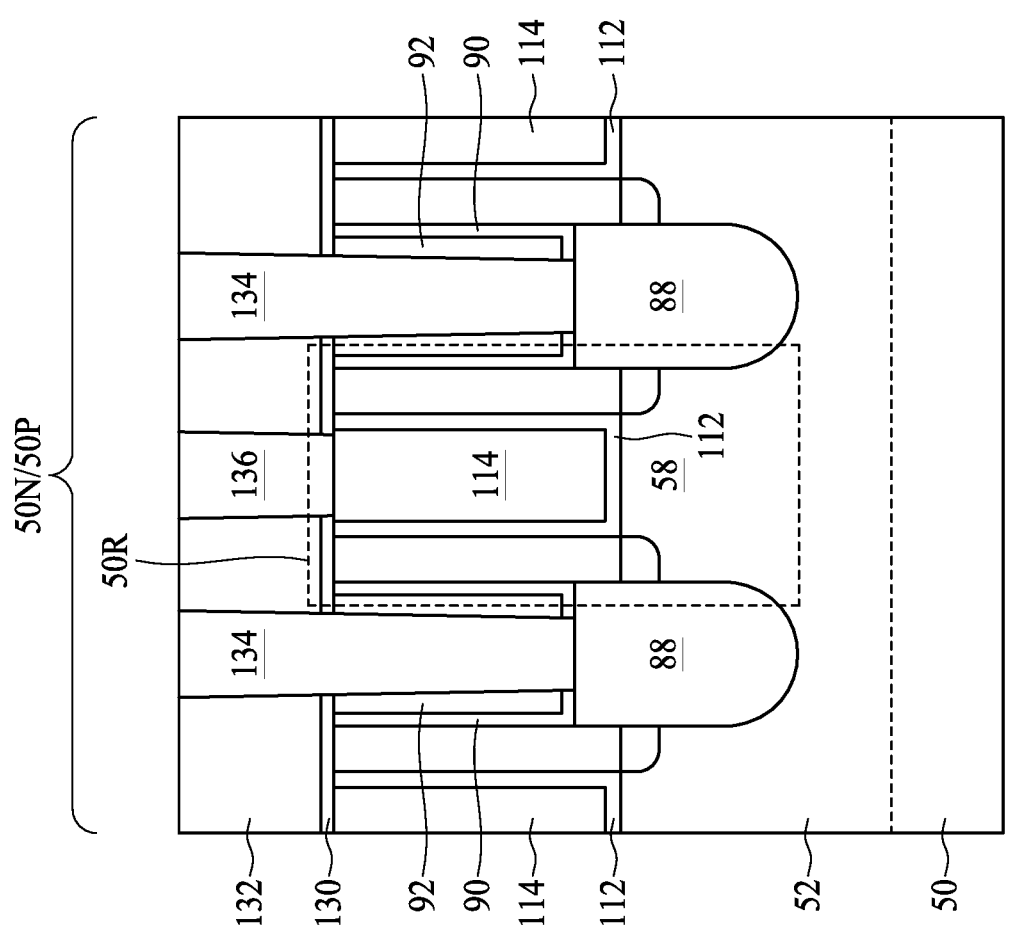

In FIGS. 19A and 19B, source/drain contacts 134 and gate contacts 136 are formed to contact, respectively, the epitaxial source/drain regions 88 and the gate electrodes 114. Openings for the source/drain contacts 134 are formed through the CESL 90, the first ILD 92, the ESL 130, and the second ILD 132. Openings for the gate contacts 136 are formed through the ESL 130 and the second ILD 132. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 132. The remaining liner and conductive material form the source/drain contacts 134 and the gate contacts 136 in the openings. An anneal process may be performed to form a silicide at the interface between the epitaxial source/drain regions 88 and the source/drain contacts 134. The source/drain contacts 134 are physically and electrically coupled to the epitaxial source/drain regions 88, and the gate contacts 136 are physically and electrically coupled to the gate electrodes 114. The source/drain contacts 134 and the gate contacts 136 may be formed in different processes, or may be formed in the same process. Although shown as being formed in the same cross-sections, it should be appreciated that each of the source/drain contacts 134 and the gate contacts 136 may be formed in different cross-sections, which may avoid shorting of the contacts.

Figure 20B:
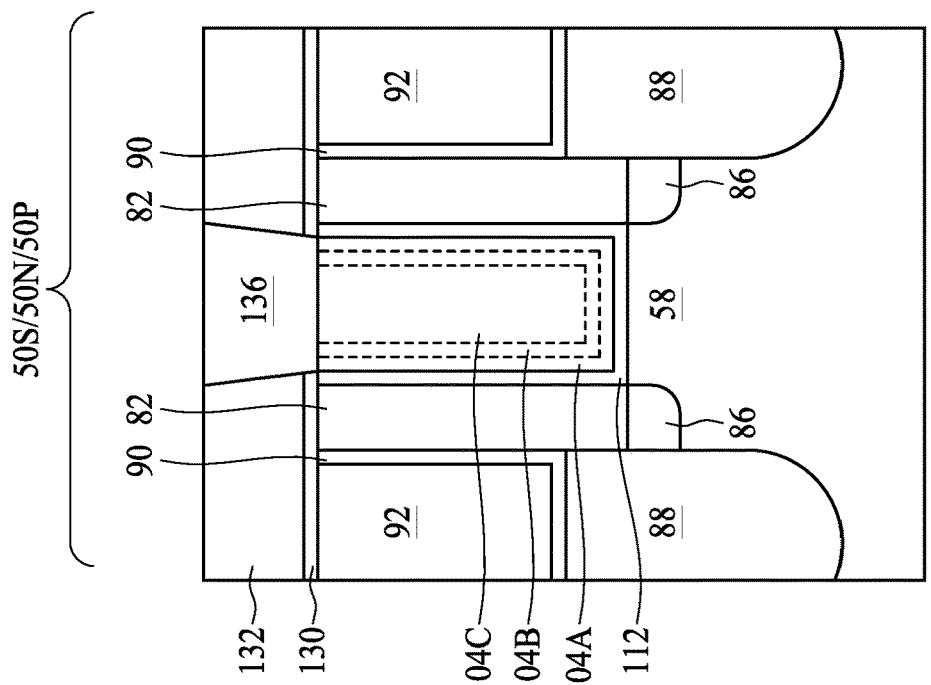
FIGS. 20A and 20B are cross-sectional views of FinFETs, in accordance with some embodiments.
Figure 20A:
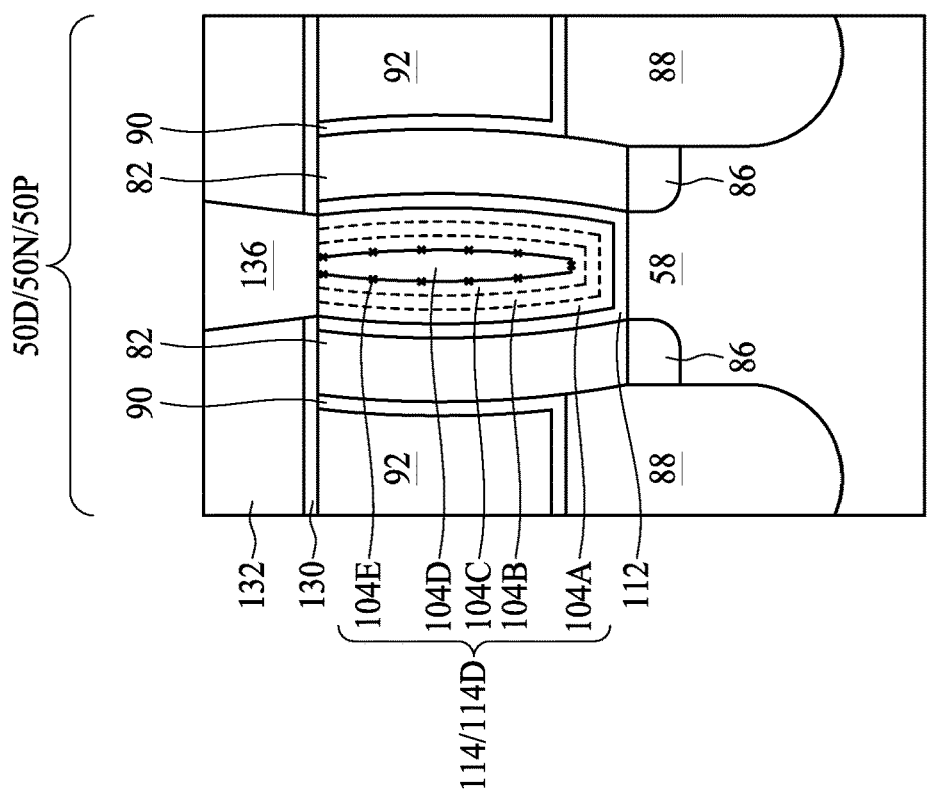

FIGS. 20A and 20B are cross-sectional views of FinFETs, in accordance with some embodiments. Devices resulting from a process including the steps of FIGS. 2 through 19B are shown. FIGS. 20A and 20B illustrate features in regions that are similar to a region 50R in FIG. 19A (in a similar manner as FIGS. 10A through 14B). The gate electrodes 114D have voids 104D, which are sealed at the top (and thus defined) by the ESL 130 and/or the gate contacts 136, and which are sealed at the side (and thus defined) by the sidewalls of the isolation regions 128 (see FIGS. 17A and 17B). Work function tuning elements 104E are in the voids 104D, such as at the inner surfaces of the gate electrodes 114D that define the voids 104D. The work function tuning elements 104E may not be at the inner surfaces of the ESL 130 and/or the gate contacts 136 that define the voids 104D. Further, the gate electrodes 114S may not have voids (or at least have smaller voids). As a result of the gate treatment processes 116, 126 the gate electrodes 114D have a greater concentration of work function tuning elements than the gate electrodes 114S. Thus, the FinFETs in the dense region 50D have different threshold voltages than the FinFETs in the dense region 50S. For example, when the FinFETs are p-type devices, the FinFETs in the dense region 50D have a lesser threshold voltage than the FinFETs in the dense region 50S.

Figure 21B:
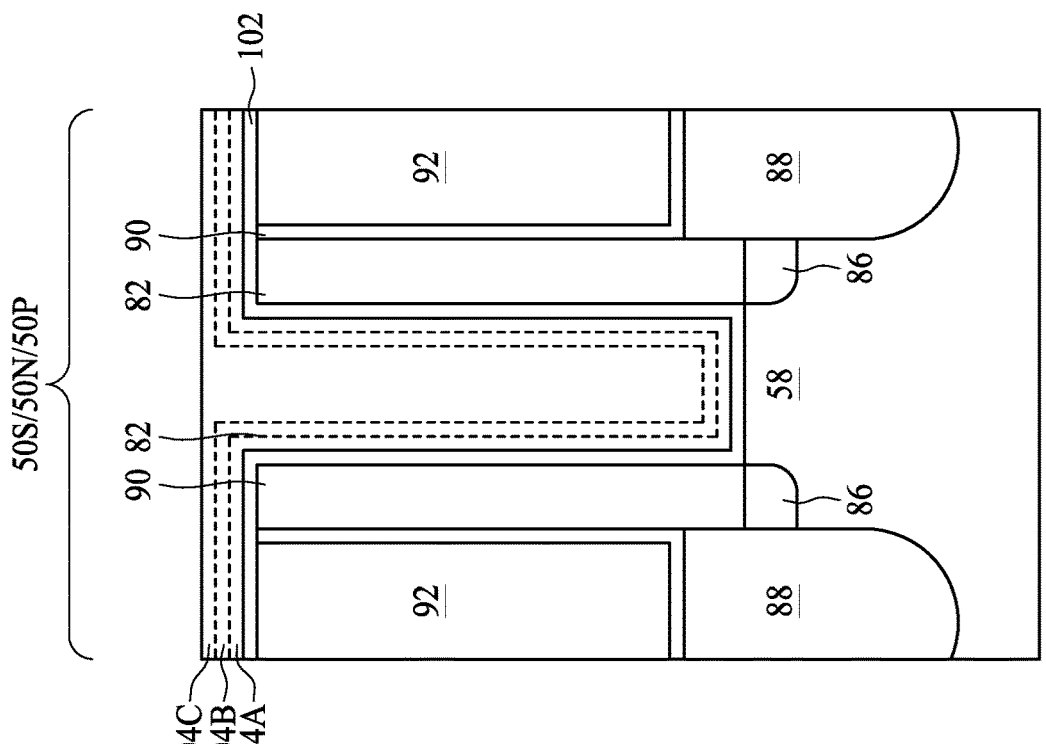
FIGS. 21A through 22B are cross-sectional views of intermediate stages in the manufacturing of FinFETs, in accordance with some other embodiments.
Figure 21A:
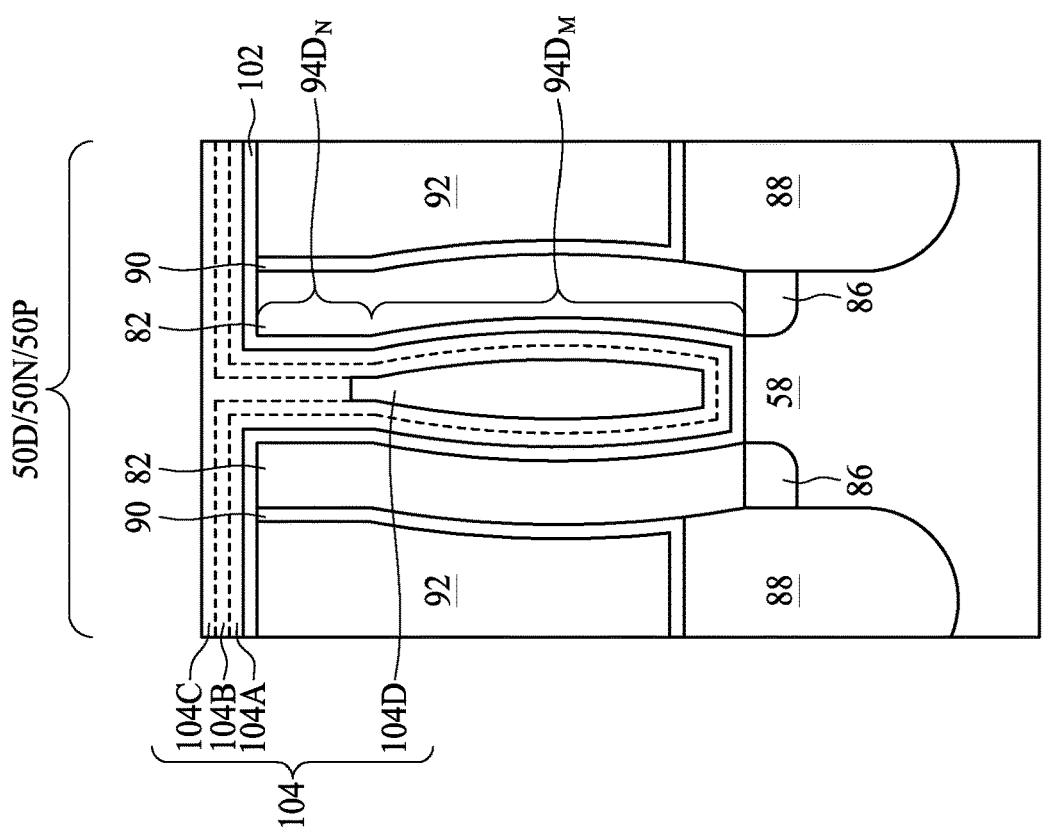
Figure 22B:
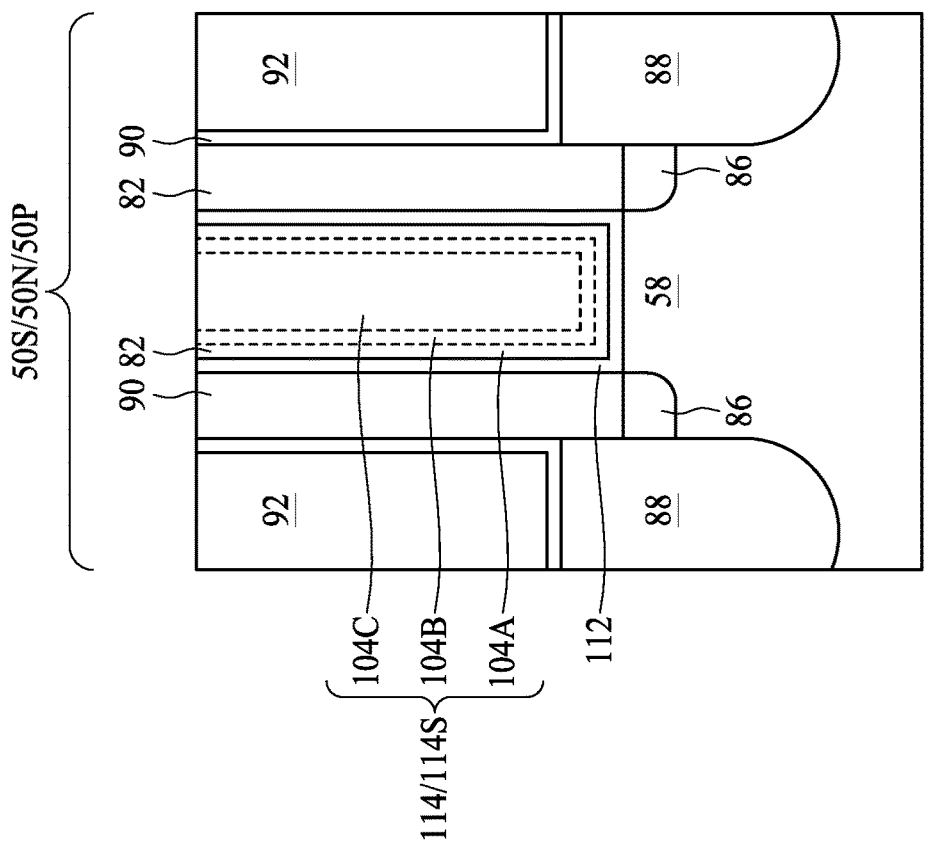
Figure 22A:
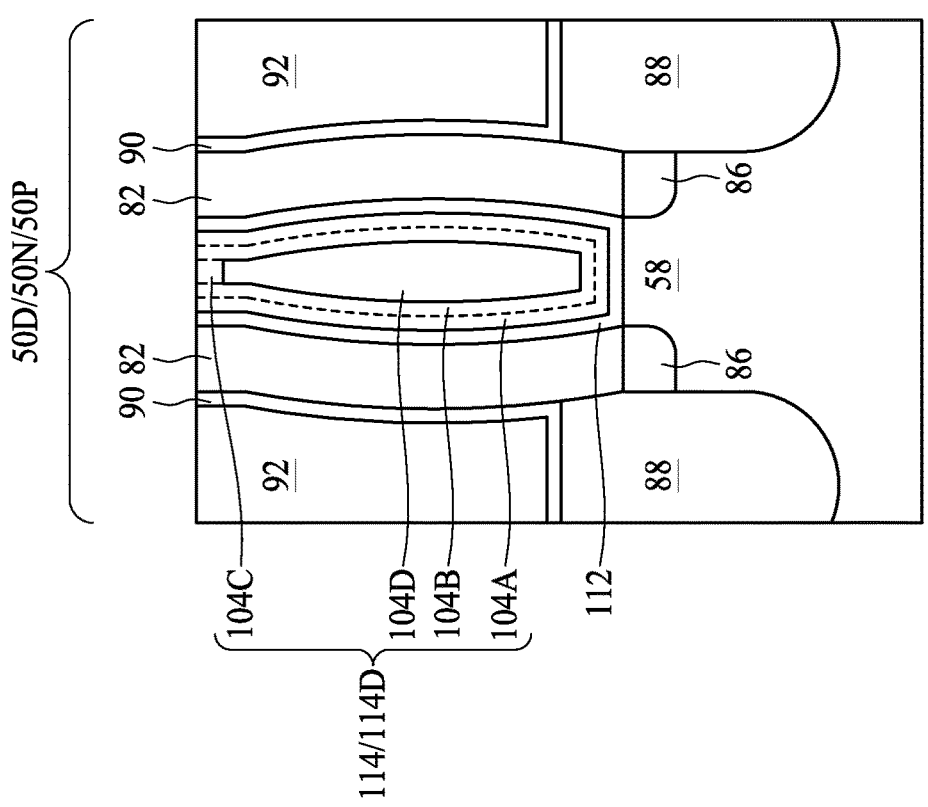

FIGS. 21A through 22B are cross-sectional views of intermediate stages in the formation of replacement gate structures, in accordance with some other embodiments. FIGS. 21A and 21B show a similar step of processing as FIGS. 11A and 11B. FIGS. 22A and 22B show a similar step of processing as FIGS. 13A and 13B. In this embodiment, pinch-off occurs during deposition of the fill layer 104C before any of the fill layer 104C is deposited in the main portions 94D$_M$ of the recesses 94D (see FIGS. 21A and 21B). Such pinch-off can occur in embodiments where multiple work function tuning layers are formed (e.g., the embodiments of FIGS. 29B and 29C) or where non-conformal deposition processes are used. Thus, the voids 104D expose surfaces of the fill layer 104C and surfaces of the glue layers 104B. In this embodiment, the height of the gate structures is controlled so that portions of the gate electrode layers 104 in the neck portions 94D$_N$ of the recesses 94D (see FIG. 21A) remain and the gate electrodes 114D still include some of the fill layer 104C after planarization (see FIGS. 22A and 22B). Thus, the gate electrodes 114S include a conformal fill layer 104C, and the gate electrodes 114D include the fill layer 104C in the neck portions 94D$_N$ of the recesses 94D. In such embodiments, the voids 104D are formed to have bottle profile shapes. The bottle profile shapes of the voids 104D can have a height in the range of about 5 nm to about 80 nm, a main portion with a width in the range of about 2 nm to about 8 nm, and a neck portion with a width in the range of about 1 nm to about 7 nm. The width of the neck portion can be up to about 88% smaller than the width at the bottom of the main portion, The maximal width of the main portion can be up to about 33% larger than the width at the bottom of the main portion. In another embodiment, the height of the gate structures is controlled so that the voids 104D are breached by the planarization process. Thus, the gate electrodes 114S include the fill layer 104C, but the gate electrodes 114D do not include a fill layer.

Figure 23B:
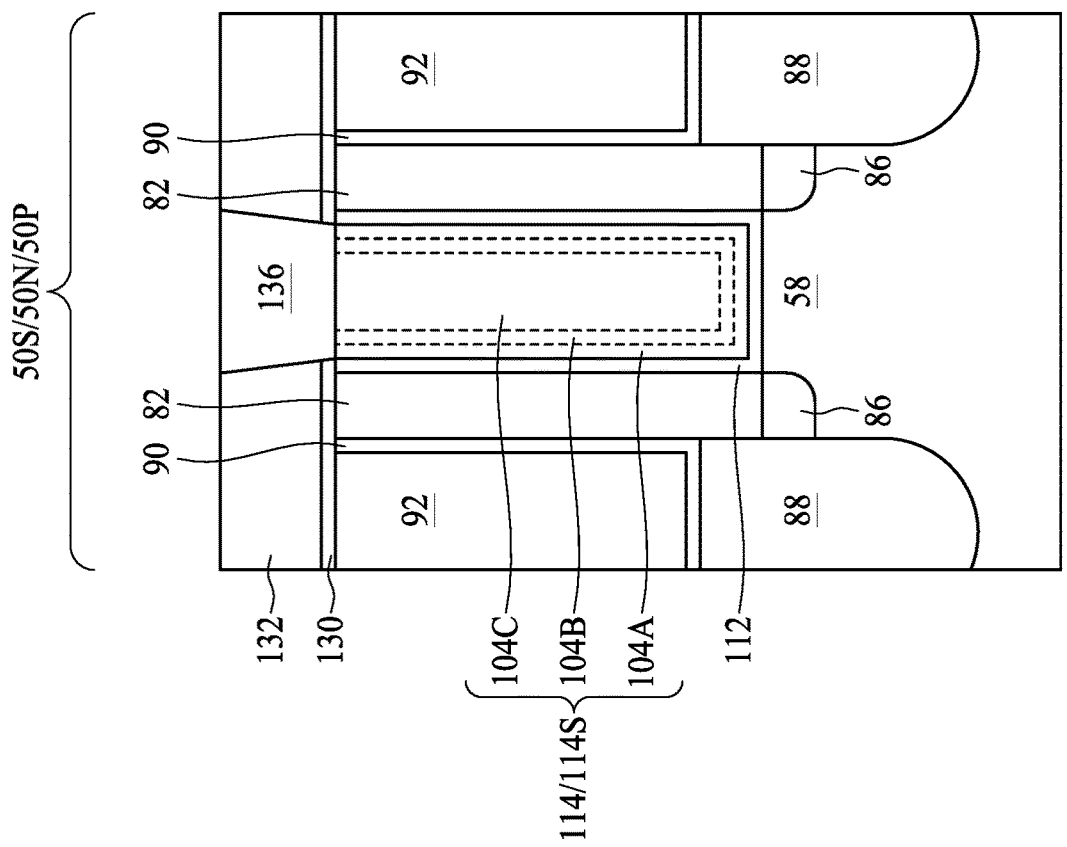
FIGS. 23A and 23B are cross-sectional views of FinFETs, in accordance with some other embodiments.
Figure 23A:
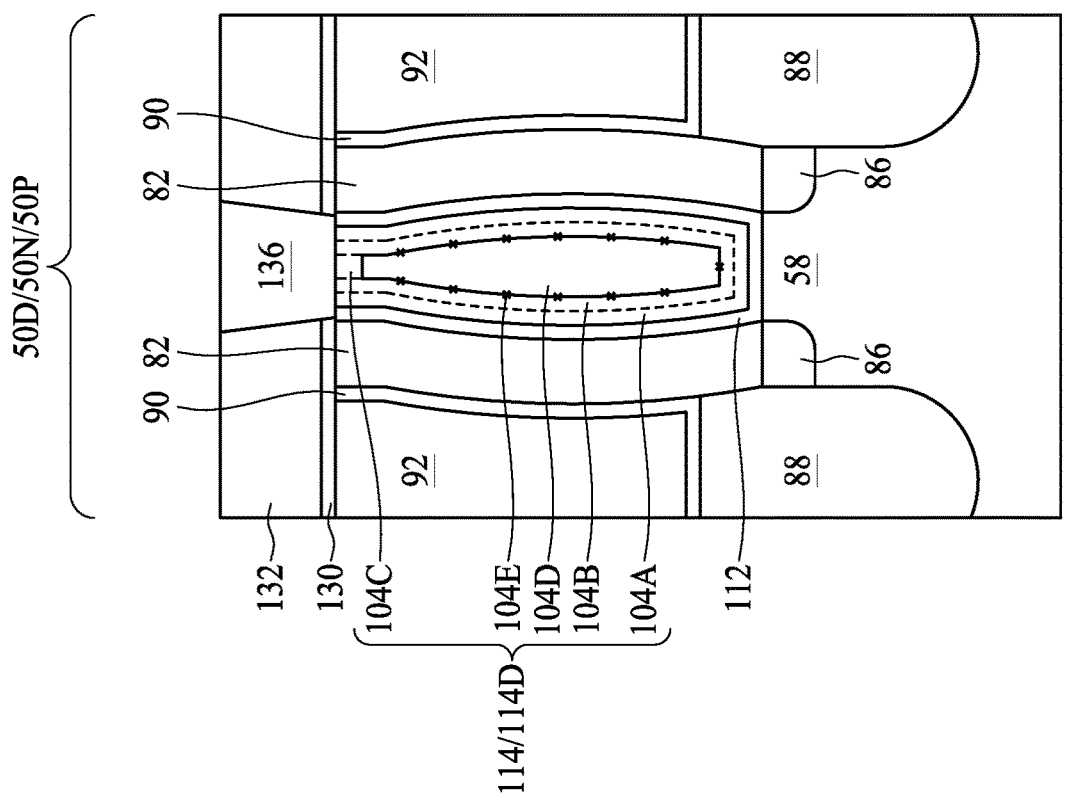

FIGS. 23A and 23B are cross-sectional views of FinFETs, in accordance with some other embodiments. Devices resulting from a process including the steps of FIGS. 21A through 22B are shown. FIGS. 23A and 23B illustrate features in regions that are similar to a region 50R in FIG. 19A (in a similar manner as FIGS. 10A through 14B).

Figure 24B:
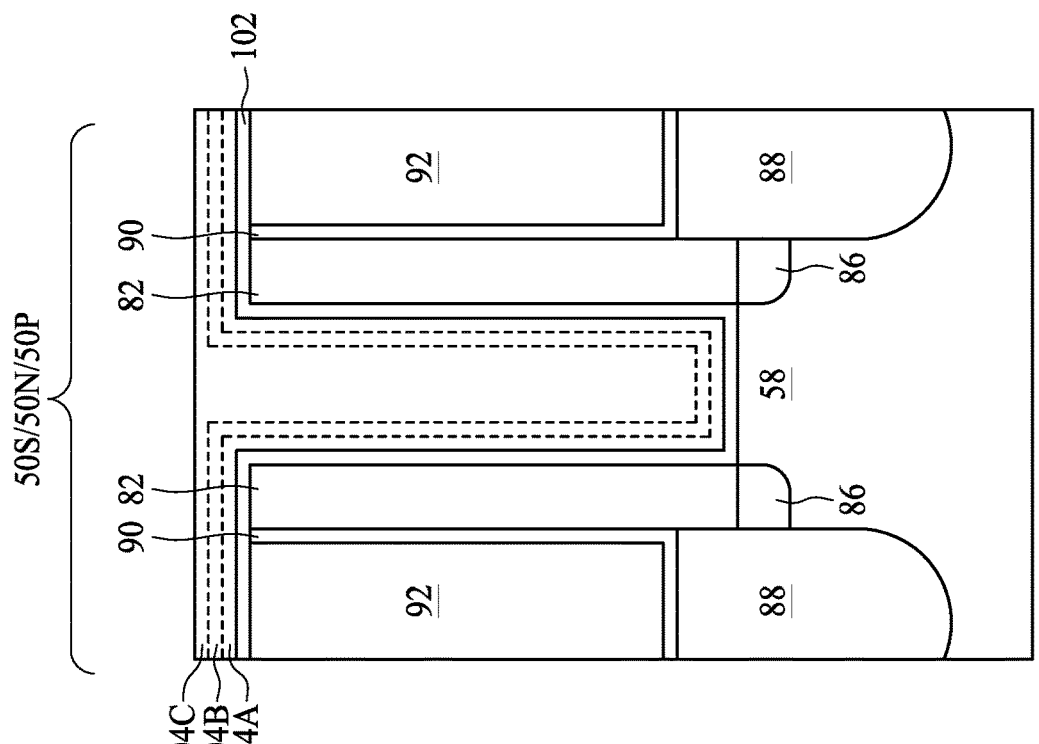
FIGS. 24A through 25B are cross-sectional views of intermediate stages in the manufacturing of FinFETs, in accordance with some other embodiments.
Figure 24A:
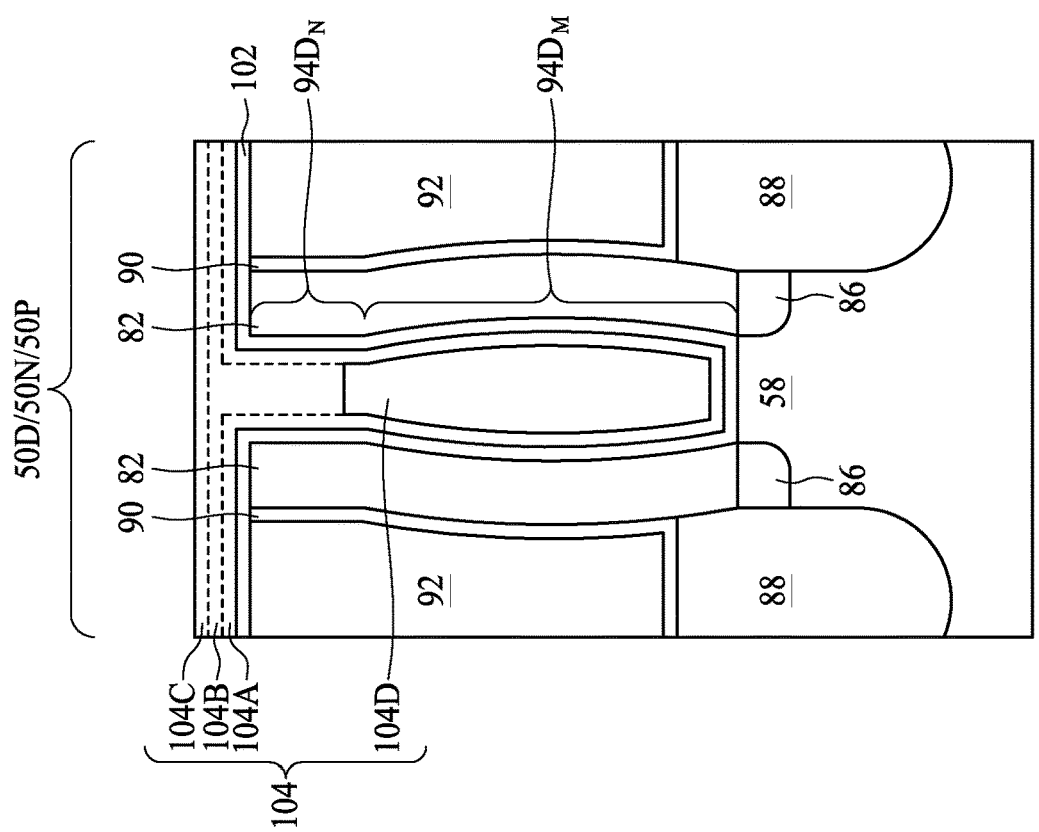
Figure 25B:
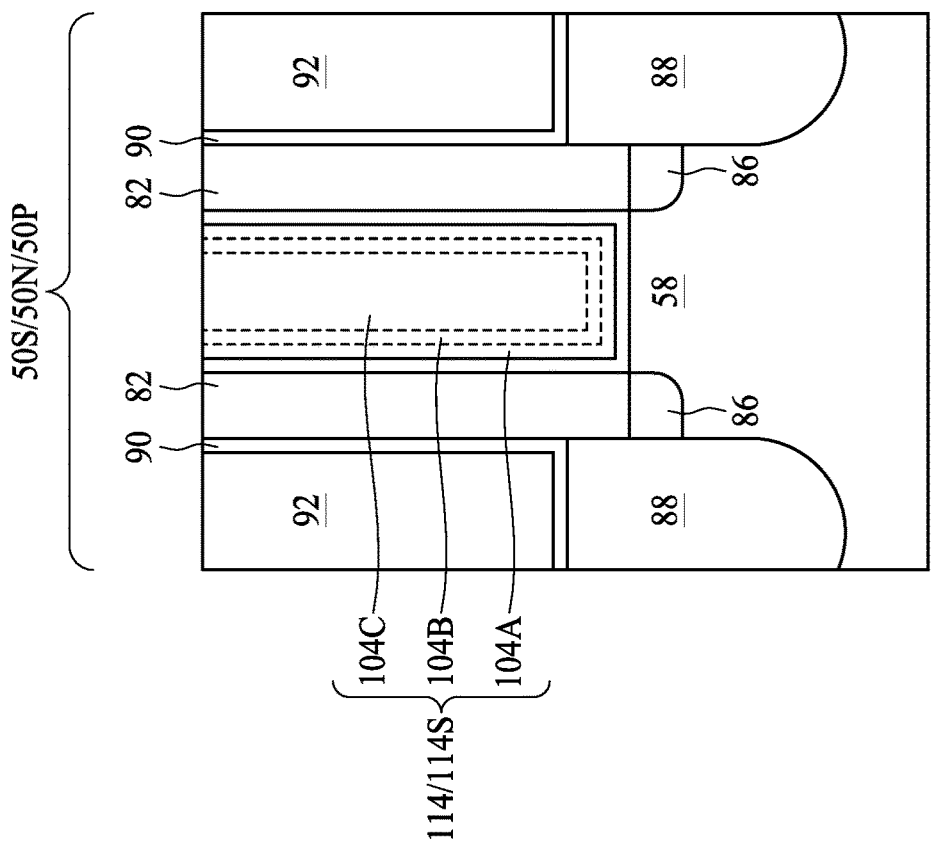
Figure 25A:
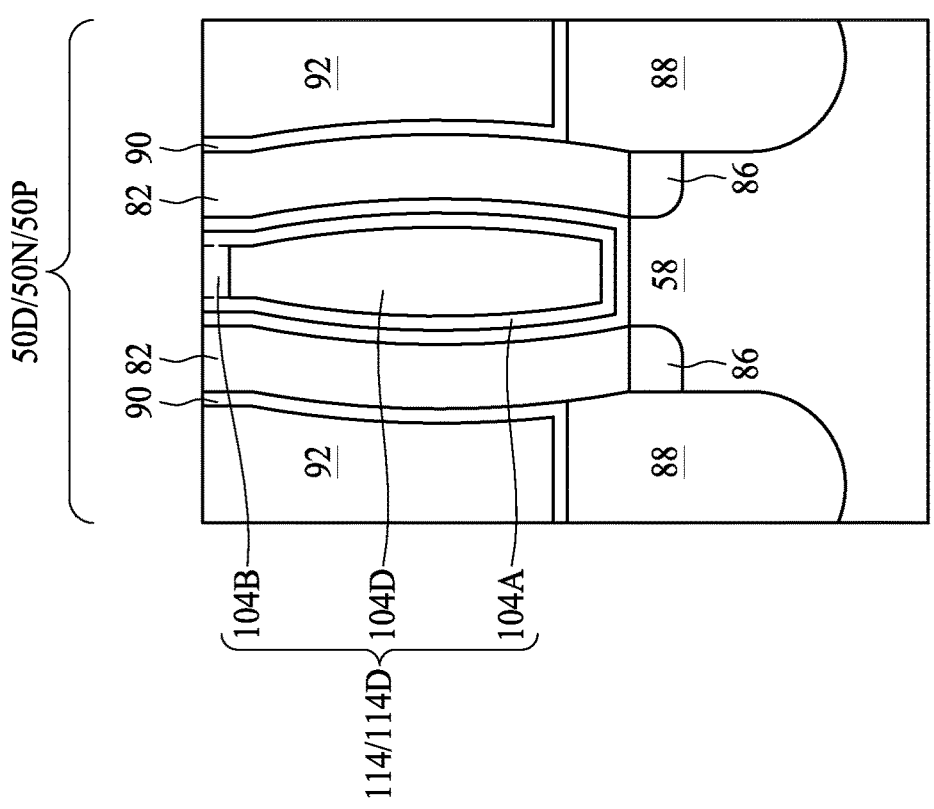

FIGS. 24A through 25B are cross-sectional views of intermediate stages in the formation of replacement gate structures, in accordance with some other embodiments. FIGS. 24A and 24B show a similar step of processing as FIGS. 11A and 11B. FIGS. 25A and 25B show a similar step of processing as FIGS. 13A and 13B. In this embodiment, pinch-off occurs during deposition of the glue layers 104B before any of the glue layers 104B are deposited in the main portions $94D_M$ of the recesses 94D (see FIGS. 24A and 24B). Such pinch-off can occur in embodiments where multiple work function tuning layers are formed (e.g., the embodiments of FIGS. 29B and 29C) or where non-conformal deposition processes are used. Thus, the voids 104D expose surfaces of the glue layers 104B and surfaces of the work function tuning layers 104A. In this embodiment, the height of the gate structures is controlled so that portions of the gate electrode layers 104 in the neck portions $94D_N$ of the recesses 94D (see FIG. 24A) remain and the gate electrodes 114D still include some of the glue layers 104B after planarization (see FIGS. 25A and 25B). Thus, the gate electrodes 114S include a conformal glue layer 104B and a conformal fill layer 104C, and the gate electrodes 114D include the glue layer 104B in the neck portions $94D_N$ of the recesses 94D. The gate electrodes 114D do not include a fill layer. In such embodiments, the voids 104D are formed to have bottle profile shapes. The bottle profile shapes of the voids 104D can have a height in the range of about 5 nm to about 80 nm, a main portion with a width in the range of about 2 nm to about 8 nm, and a neck portion with a width in the range of about 1 nm to about 7 nm. The width of the neck portion can be up to about 88% smaller than the width at the bottom of the main portion. The maximal width of the main portion can be up to about 33% larger than the width at the bottom of the main portion. In another embodiment, the height of the gate structures is controlled so that the voids 104D are breached by the planarization process. Thus, the gate electrodes 114S include the glue layer 104B and the fill layer 104C, but the gate electrodes 114D do not include a glue layer or a fill layer.

Figure 26B:
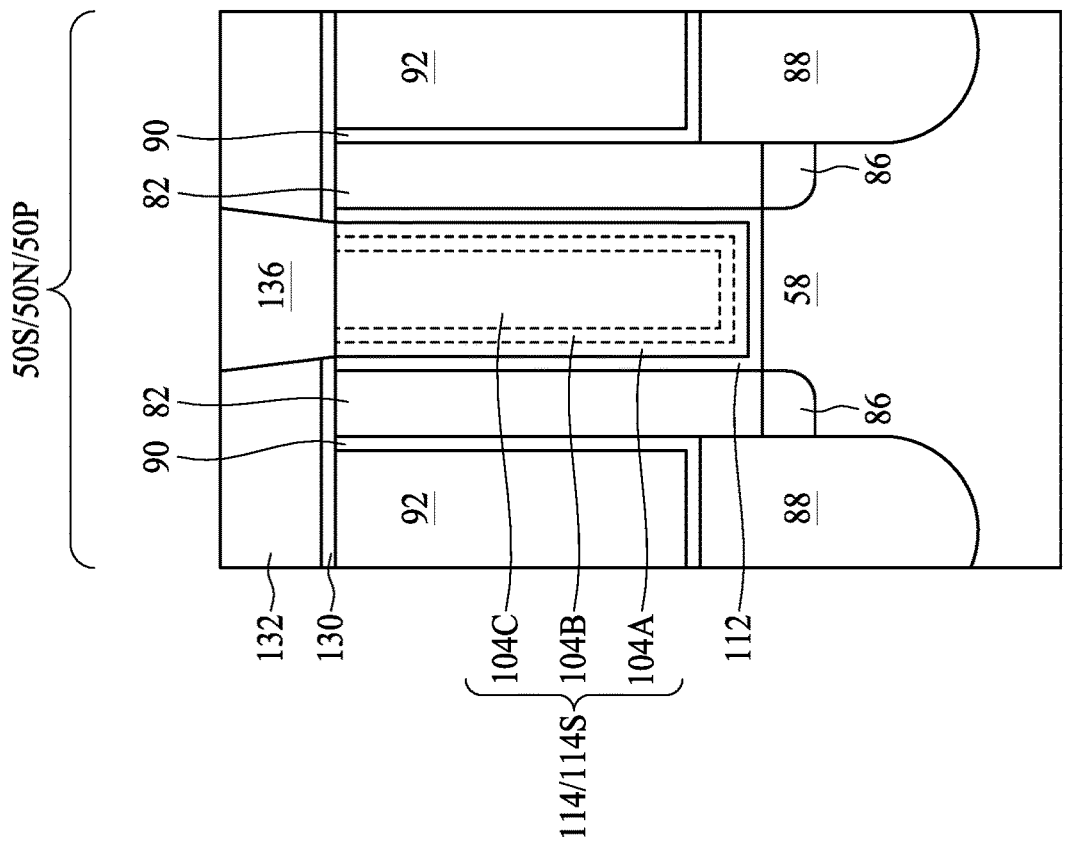
FIGS. 26A and 26B are cross-sectional views of FinFETs, in accordance with some other embodiments.
Figure 26A:
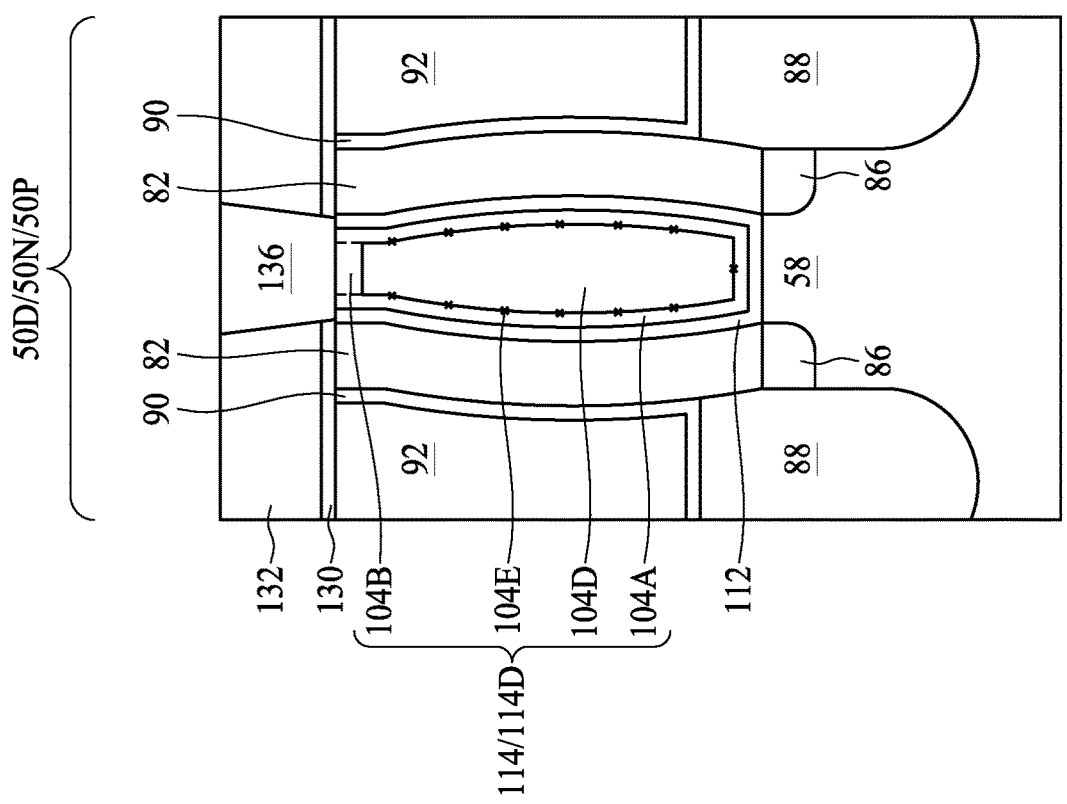

FIGS. 26A and 26B are cross-sectional views of FinFETs, in accordance with some other embodiments. Devices resulting from a process including the steps of FIGS. 24A through 25B are shown. FIGS. 26A and 26B illustrate features in regions that are similar to a region 50R in FIG. 19A (in a similar manner as FIGS. 10A through 14B).

Figure 27:
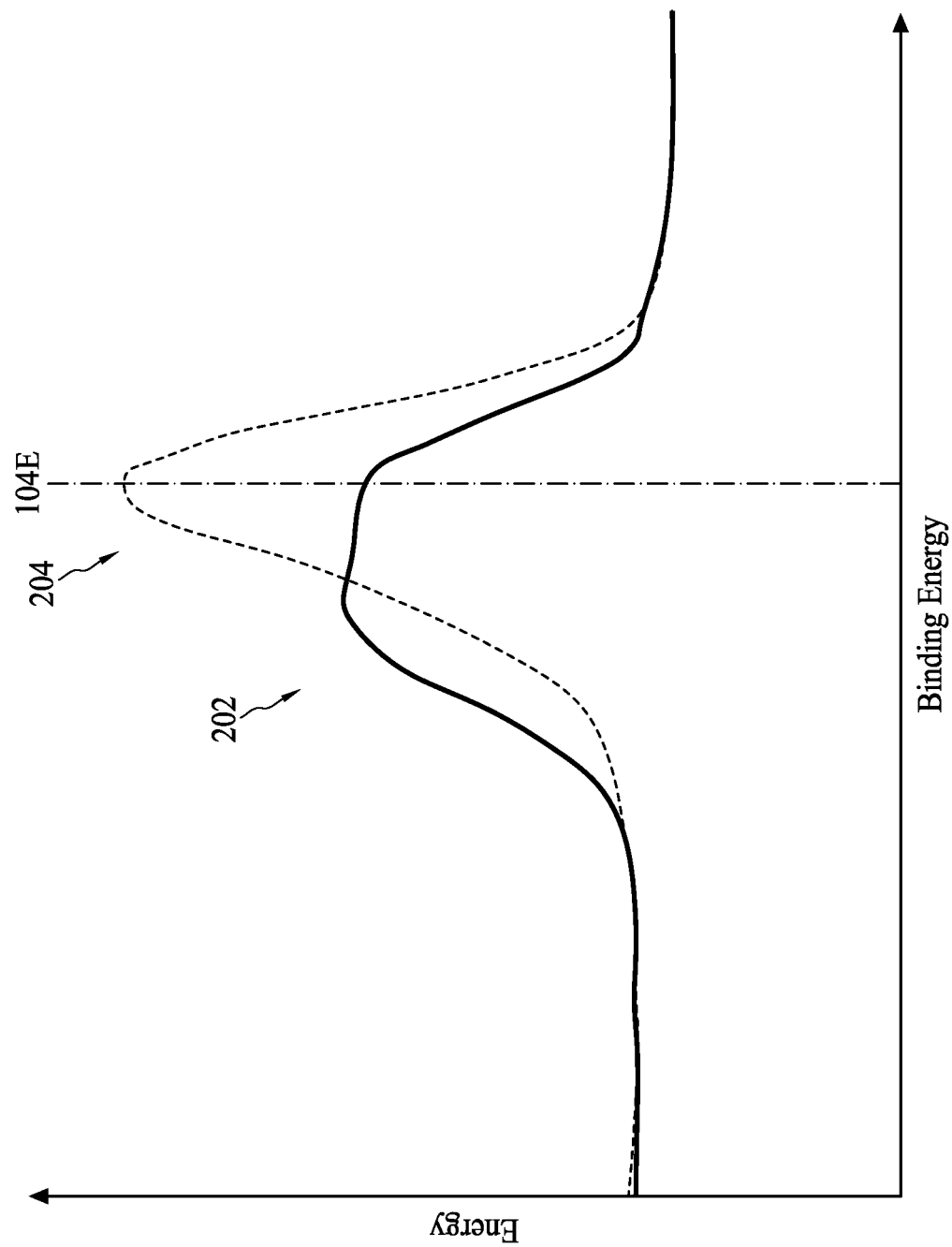
FIG. 27 is a spectrogram showing the composition of gate electrodes, in accordance with some embodiments.

FIG. 27 is a spectrogram showing the composition of the gate electrodes 114 after the gate treatment processes 116, 126. A first set of data 202 shows the composition of a fill layer of a gate electrode that was formed without the gate treatment processes 116, 126. A second set of data 204 shows the composition of a fill layer of a gate electrode that was formed with the gate treatment processes 116, 126. As shown, the quantity of work function tuning elements 104E measured in the gate electrodes is significantly increased by the gate treatment processes 116, 126.

Figure 28:
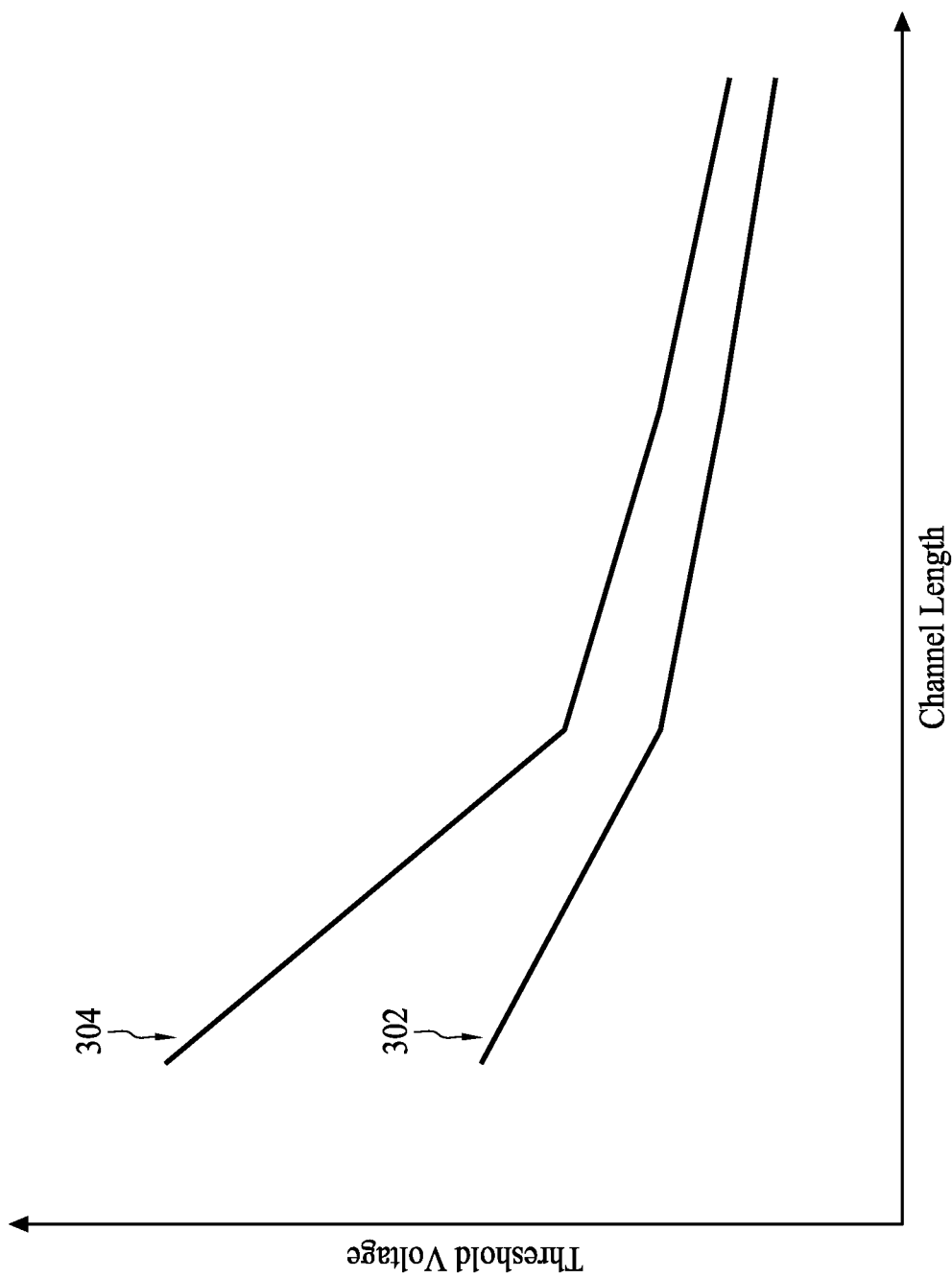
FIG. 28 is a graph showing threshold voltages of devices, in accordance with some embodiments.

FIG. 28 is a graph showing threshold voltages of the resulting devices. A first set of data 302 shows the threshold voltages of devices that were formed without the gate treatment processes 116, 126. A second set of data 304 shows the threshold voltages of devices that were formed with the gate treatment processes 116, 126. As can be seen, the gate treatment processes 116, 126 caused devices with shorter channel lengths to experience a greater increase in threshold voltages than devices with longer channel lengths. This increase is due to the formation of voids in the gate electrodes of devices of shorter channel lengths. In one example, the devices with shorter channel lengths experienced from about 20 mV to about 100 mV increase in threshold voltage.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate structures and source/drain regions are formed in a manner similar to the above-described embodiments. After the dummy gate structures are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Embodiments may achieve advantages. Forming the voids 104D in the gate electrodes 114D allows the gate treatment processes 116, 126 to affect the gate electrodes 114D more than the gate electrodes 114S by nature of the increased surface area of the gate electrodes 114D that is exposed by the voids 104D. The gate treatment processes 116, 126 may thus incorporate more work function tuning elements (e.g., fluorine, nitrogen, oxygen, chlorine, boron, silicon, etc.) into the gate electrodes 114D than the gate electrodes 114S. As such, the gate treatment processes 116, 126 may be used to selectively tune the threshold voltages of devices in the dense region 50D, even when the gate treatment processes 116, 126 is performed in both the dense region 50D and the sparse region 50S. Thus, the FinFETs formed with the gate electrodes 114D have different threshold voltages than the FinFETs formed with the gate electrodes 114S. For example, when the FinFETs are p-type devices, the FinFETs formed with the gate electrodes 114D can have a lesser threshold voltage than the FinFETs formed with the gate electrodes 114S.

In an embodiment, a device includes: a gate dielectric over a substrate; a gate electrode over the gate dielectric, the gate electrode including: a work function tuning layer over the gate dielectric; a glue layer over the work function tuning layer; a fill layer over the glue layer; and a void defined by inner surfaces of at least one of the fill layer, the glue layer, and the work function tuning layer, a material of the gate electrode at the inner surfaces including a work function tuning element. In some embodiments of the device, the inner surfaces are the inner surfaces of the fill layer, and the work function tuning layer is the only work function tuning layer between the glue layer and the gate dielectric. In some embodiments of the device, the inner surfaces are the inner surfaces of the glue layer, and the work function tuning layer is one of a plurality of work function tuning layers between the glue layer and the gate dielectric. In some embodiments of the device, the inner surfaces are the inner surfaces of the work function tuning layer, and the work function tuning layer is one of a plurality of work function tuning layers between the glue layer and the gate dielectric. In some embodiments of the device, the work function tuning element is fluorine, nitrogen, oxygen, chlorine, boron, or silicon. In some embodiments of the device, the material of the gate electrode at the inner surfaces includes the work function tuning element at a concentration in the range of 1 at. % to 28 at. %. In some embodiments, the device further includes: a contact over the gate electrode, the void further defined by a bottom surface of the contact. In some embodiments, the device further includes: an isolation region adjacent an end of the gate electrode, the void further defined by a sidewall of the isolation region.

In an embodiment, a device includes: a first transistor including: a first channel region, the first channel region having a first length; and a first gate structure over the first channel region, the first gate structure including a first gate electrode, the first gate electrode having a void therein; and a second transistor includes: a second channel region, the second channel region having a second length, the second length greater than the first length; and a second gate structure over the second channel region, the second gate structure including a second gate electrode, the second gate electrode being free of voids, the second gate electrode having a different work function than the first gate electrode. In some embodiments of the device, the first gate electrode includes a metal and a work function tuning element, and the second gate electrode includes the metal and is free of the work function tuning element. In some embodiments of the device, the metal is tungsten and the work function tuning element is fluorine, nitrogen, oxygen, chlorine, boron, or silicon. In some embodiments, the device further includes: a first gate spacer adjacent the first gate structure, the first gate spacer having bowed sidewalls; and a second gate spacer adjacent the second gate structure, the second gate spacer having straight sidewalls. In some embodiments, the device further includes: a first gate mask over the first gate structure; and an isolation region adjacent an end of the first gate structure, the void being defined by surfaces of the isolation region, the first gate mask, and the first gate electrode.

In an embodiment, a method includes: removing a dummy gate to form a recess between gate spacers; depositing a gate dielectric layer in the recess; depositing gate electrode layers on the gate dielectric layer, inner surfaces of the gate electrode layers defining a void; planarizing top surfaces of the gate electrode layers until the void is exposed at the top surfaces of the gate electrode layers; and performing a first gate treatment process in the void, the first gate treatment process increasing a concentration of a work function tuning element at the inner surfaces of the gate electrode layers that define the void. In some embodiments of the method, the recess has main portion and a neck portion, the gate electrode layers completely filling the neck portion of the recess, the gate electrode layers partially filling the main portion of the recess to define the void. In some embodiments of the method, the work function tuning element is fluorine and the first gate treatment process is a fluorination treatment process. In some embodiments of the method, the work function tuning element is nitrogen and the first gate treatment process is a nitridation treatment process. In some embodiments of the method, the work function tuning element is oxygen and the first gate treatment process is an oxidation treatment process. In some embodiments of the method, the work function tuning element is chlorine, boron, or silicon, and the first gate treatment process is a deposition process. In some embodiments, the method further includes: forming an opening in the gate electrode layers, the void being exposed at a sidewall of the gate electrode layers after forming the opening; and performing a second gate treatment process in the void, the second gate treatment process increasing the concentration of the work function tuning element at the inner surfaces of the gate electrode layers that define the void.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a gate dielectric over a substrate;
   a gate electrode over the gate dielectric, the gate electrode comprising:
      a work function tuning layer over the gate dielectric;
      a glue layer over the work function tuning layer;
      a fill layer over the glue layer;
      a void defined by inner surfaces of at least one of the fill layer, the glue layer, and the work function tuning layer, a material of the gate electrode at the inner surfaces comprising a work function tuning element; and
   an isolation region adjacent an end of the gate electrode, the void further defined by a sidewall of the isolation region.

2. The device of claim 1, wherein the inner surfaces are the inner surfaces of the fill layer, and wherein the work function tuning layer is an only work function tuning layer between the glue layer and the gate dielectric.

3. The device of claim 1, wherein the inner surfaces are the inner surfaces of the glue layer, and wherein the work function tuning layer is one of a plurality of work function tuning layers between the glue layer and the gate dielectric.

4. The device of claim 1, wherein the inner surfaces are the inner surfaces of the work function tuning layer, and wherein the work function tuning layer is one of a plurality of work function tuning layers between the glue layer and the gate dielectric.

5. The device of claim 1, wherein the work function tuning element is fluorine, nitrogen, oxygen, chlorine, boron, or silicon.

6. The device of claim 1, wherein the material of the gate electrode at the inner surfaces comprises the work function tuning element at a concentration in a range of 1 at. % to 28 at. %.

7. The device of claim 1 further comprising:
   a contact over the gate electrode, the void further defined by a bottom surface of the contact.

8. A device comprising:
   a first transistor comprising:
      a first channel region, the first channel region having a first length; and a first gate structure over the first channel region, the first gate structure comprising a first gate electrode, the first gate electrode having a void therein; and a second transistor comprising:
- a second channel region, the second channel region having a second length, the second length greater than the first length; and
- a second gate structure over the second channel region, the second gate structure comprising a second gate electrode, the second gate electrode being free of voids, the second gate electrode having a different work function than the first gate electrode.

9. The device of claim 8, wherein the first gate electrode comprises a metal and a work function tuning element, and wherein the second gate electrode comprises the metal and is free of the work function tuning element.

10. The device of claim 9, wherein the metal is tungsten and the work function tuning element is fluorine, nitrogen, oxygen, chlorine, boron, or silicon.

11. The device of claim 8 further comprising:
a first gate spacer adjacent the first gate structure, the first gate spacer having bowed sidewalls; and
a second gate spacer adjacent the second gate structure, the second gate spacer having straight sidewalls.

12. The device of claim 8 further comprising:
a first gate mask over the first gate structure; and
an isolation region adjacent an end of the first gate structure, the void defined by surfaces of the isolation region, the first gate mask, and the first gate electrode.

13. A method comprising:
removing a dummy gate to form a recess between gate spacers;
depositing a gate dielectric layer in the recess;
depositing gate electrode layers on the gate dielectric layer, inner surfaces of the gate electrode layers defining a void;
planarizing top surfaces of the gate electrode layers until the void is exposed at the top surfaces of the gate electrode layers; and
performing a first gate treatment process in the void, the first gate treatment process increasing a concentration of a work function tuning element at the inner surfaces of the gate electrode layers that define the void.

14. The method of claim 13, wherein the recess has main portion and a neck portion, the gate electrode layers completely filling the neck portion of the recess, the gate electrode layers partially filling the main portion of the recess to define the void.

15. The method of claim 13, wherein the work function tuning element is fluorine and the first gate treatment process is a fluorination treatment process.

16. The method of claim 13, wherein the work function tuning element is nitrogen and the first gate treatment process is a nitridation treatment process.

17. The method of claim 13, wherein the work function tuning element is oxygen and the first gate treatment process is an oxidation treatment process.

18. The method of claim 13, wherein the work function tuning element is chlorine, boron, or silicon, and the first gate treatment process is a deposition process.

19. The method of claim 13 further comprising:
forming an opening in the gate electrode layers, the void exposed at a sidewall of the gate electrode layers after forming the opening; and
performing a second gate treatment process in the void, the second gate treatment process increasing the concentration of the work function tuning element at the inner surfaces of the gate electrode layers that define the void.

20. The method of claim 19, wherein the second gate treatment process is different from the first gate treatment process.

* * * * *